United States Patent
Organvidez et al.

(10) Patent No.: US 6,653,899 B2
(45) Date of Patent: *Nov. 25, 2003

(54) AUDIO AMPLIFIER POWER AND TEMPERATURE CONTROLLER HAVING NETWORK DETECTING AND ASSOCIATED METHODS

(75) Inventors: Juan H. Organvidez, Miami, FL (US); Felix C. Quintanar, Miami, FL (US)

(73) Assignee: Niles Audio Corporation, Miami, FL (US)

( * ) Notice: Subject to any disclaimer, the term of this patent is extended or adjusted under 35 U.S.C. 154(b) by 48 days.

This patent is subject to a terminal disclaimer.

(21) Appl. No.: 09/882,999

(22) Filed: Jun. 15, 2001

(65) Prior Publication Data

US 2002/0011899 A1 Jan. 31, 2002

Related U.S. Application Data

(60) Provisional application No. 60/212,161, filed on Jun. 16, 2000.

(51) Int. Cl.$^7$ .............................. H03F 21/00; H03F 1/52
(52) U.S. Cl. .................... 330/207 P; 330/289; 330/298
(58) Field of Search .............................. 330/51, 207 P, 330/289, 298; 381/120

(56) References Cited

U.S. PATENT DOCUMENTS

| | | | |
|---|---|---|---|
| 3,694,764 A | * | 9/1972 | Barron .................... 330/207 P |
| 5,331,291 A | | 7/1994 | D'Agostino et al. |
| 5,499,154 A | * | 3/1996 | Cullison ..................... 323/901 |
| 5,532,649 A | * | 7/1996 | Sahyoun ..................... 330/297 |
| 5,767,744 A | * | 6/1998 | Irwin et al. ................. 330/298 |
| 5,818,301 A | | 10/1998 | Higashiyama et al. |
| 5,847,610 A | | 12/1998 | Fujita |
| 6,154,375 A | * | 11/2000 | Majid et al. ................ 323/901 |

* cited by examiner

Primary Examiner—Robert Pascal
Assistant Examiner—Khanh Van Nguyen
(74) Attorney, Agent, or Firm—Lott & Friedland, P.A.

(57) ABSTRACT

An audio amplifier power and temperature controller and associated method are provided which preferably includes a power receiving circuit for receiving power from a power source to an audio amplifier and a power condition switching control circuit responsive to the power receiving means for switching components of an audio amplifier during a plurality of power conditions. The power condition switching control circuit preferably includes a network detecting circuit responsive to the power receiving circuit for detecting network conditions, a thermal status monitoring and controlling circuit for monitoring thermal status of audio amplifier components and responsively decreasing power to the audio amplifier components to protect the audio amplifier components against damage caused by excess heat and for responsively increasing power when the audio amplifier components return to normal thermal operating conditions, and an audio power sensing and processing circuit responsive to the power receiving circuit for monitoring audio power input conditions to the audio amplifier to enhance source output and to reduce or eliminate noise such as due to other components within a network system.

29 Claims, 42 Drawing Sheets

AUDIO AMPLIFIER POWER AND TEMPERATURE CONTROLLER HAVING NETWORK DETECTING AND ASSOCIATED METHODS

CLAIM OF PRIORITY

This application is related to U.S. provisional application Serial No. 60/212,161 filed on Jun. 16, 2000 based upon which priority is claimed pursuant to 35 U.S.C. §199(e) and which is incorporated herein by reference in its entirety.

FIELD OF THE INVENTION

The present invention relates to the stereo and audio industries, and more particularly, to the field of audio amplifiers for amplifying audio and related methods.

BACKGROUND OF THE INVENTION

Over the years, the stereo and audio industries have grown dramatically. As additional capabilities of audio and stereo equipment have advanced, continual cost pressure from consumers and increased worldwide competition have, over the years, forced prices audio and stereo equipment down. The referenced audio and stereo equipment includes, for example, audio amplifiers, power boosters, power supplies, receivers, transmitters, radios, clocks, tuners, speakers, tape players and recorders, compact disc players, and various other equipment known to those skilled in the art.

In the power audio amplifier field, many advancements have focused on improved techniques for generation of high acoustic power signals with high bandwidth and low distortion. Also, improvements have been made in methods for supplying power to audio amplifiers. Power audio amplifiers traditionally use two separate power sources, a high voltage source and a low voltage source. A switching transistor is often used to switch between the low and the high voltage sources. Under most circumstances, an audio signal to be output is detected by power sensing equipment. When the power level of the signal exceeds a pre-selected level, the switching transistor thrown so as to supply power from the high voltage source. When the level of the audio signal is below the pre-selected level, the switching transistor is thrown so as to supply power from the low voltage source. However, high levels of power, especially for relatively prolonged periods of time, or as a result of sudden surges, can overheat, and severely damage, the switching transistors and other electronic components of audio amplifiers.

To address the overheating problems, power amplifiers have been developed with temperature controls which attempt to protect the transistors and other electronic components from overheating. Examples of such power amplifiers can be seen in U.S. Pat. No. 5,818,301 to Higashiyama et al. and U.S. Pat. No. 5,331,291 to D'Agostino et al. Although these inventions describe methods to protect components from overheating during relatively prolonged exposure to high voltages, they do not do a good job of protecting components from momentary high voltage surges, such as those occurring during start-up, which can quickly damage the transistors and other electronic components.

To address the power surge problems, circuits have been developed which detect abnormally high voltage levels and cut off, or isolate, portions of a power amplifier circuit in order to protect them. An example of such a circuit can be seen in U.S. Pat. No. 5,847,610 to Fujita. However, such power circuits are poor at addressing power surges during start-up problems, are subject to problems in discriminating between true power surge conditions and false readings. These circuits also little to address thermal overheat conditions, and do not adjust well to different power conditions.

In addition, audio amplifiers have been developed to network, or interface, with automation and networked intercommunication systems within homes, offices, and other settings. These network-enabled amplifiers, however, generally lack the ability to control network functions within the networked system they are integrated into. In other words, the subject network often has a controller to control functions in the audio amplifier, but the audio amplifier is not designed to take advantage, and cannot make use, of network functions to improve its audio performance.

SUMMARY OF THE INVENTION

With the foregoing in mind, the present invention advantageously provides and audio amplifier controller for and audio amplifier and associated methods which limits in-rush current during start up and slowly ramps up to a high power and amplifier state. The present invention also advantageously provides an audio amplifier controller which in combination allows for power discrimination capabilities, thermal monitoring capabilities to enhance protection for power audio amplifiers during various power surge and temperature increasing conditions, and network detecting and processing for enhancing interface with, responsiveness to, and control of conditions or activities within a network such as home, office, or other facility automation. The present invention additionally advantageously provides and audio amplifier controller which monitors the current output of the amplifier to protect speakers or other devices by disconnecting the load to the output circuits during high or over current conditions and then continues to monitor the current output to resume normal conditions if desirable. The present invention also provides a controller for and audio amplifier which protects the amplifier from going into and remaining in a circuit protection mode by continuously monitoring for normal current conditions. The present invention further advantageously provides and audio amplifier having and audio controller and associated methods which detects voltage level changes by frequency changes and voltage nulls. The present invention still further provides an audio amplifier with internal network temperature conditions, current conditions, and voltage conditions.

More particularly, the present invention provides an audio amplifier power and temperature controller comprising power receiving means for receiving power from a power source to an audio amplifier; power condition switching control means responsive to the power receiving means for switching components of an audio amplifier during a plurality of power conditions, the power condition switching control means including thermal status monitoring and controlling means for monitoring thermal status of operating values of audio amplifier components and responsively decreasing power to the audio amplifier components to protect the audio amplifier components against damage caused by excess heat and for responsively increasing power when the audio amplifier components return to normal thermal operating conditions; and network condition monitoring means for monitoring network conditions of the audio amplifier to protect and enhance performance the audio amplifier within a network.

BRIEF DESCRIPTION OF THE DRAWINGS

Other objects, features and advantages of the present invention will become apparent from the detailed description of the invention which follows, when considered in light of the accompanying drawings in which.

DETAILED DESCRIPTION OF THE PREFERRED EMBODIMENTS

The present invention will now be described more fully hereinafter with reference to the accompanying drawings which illustrate preferred embodiments of the invention. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, the prime notation, if used, indicated similar elements in alternative embodiments.

Figure 1:
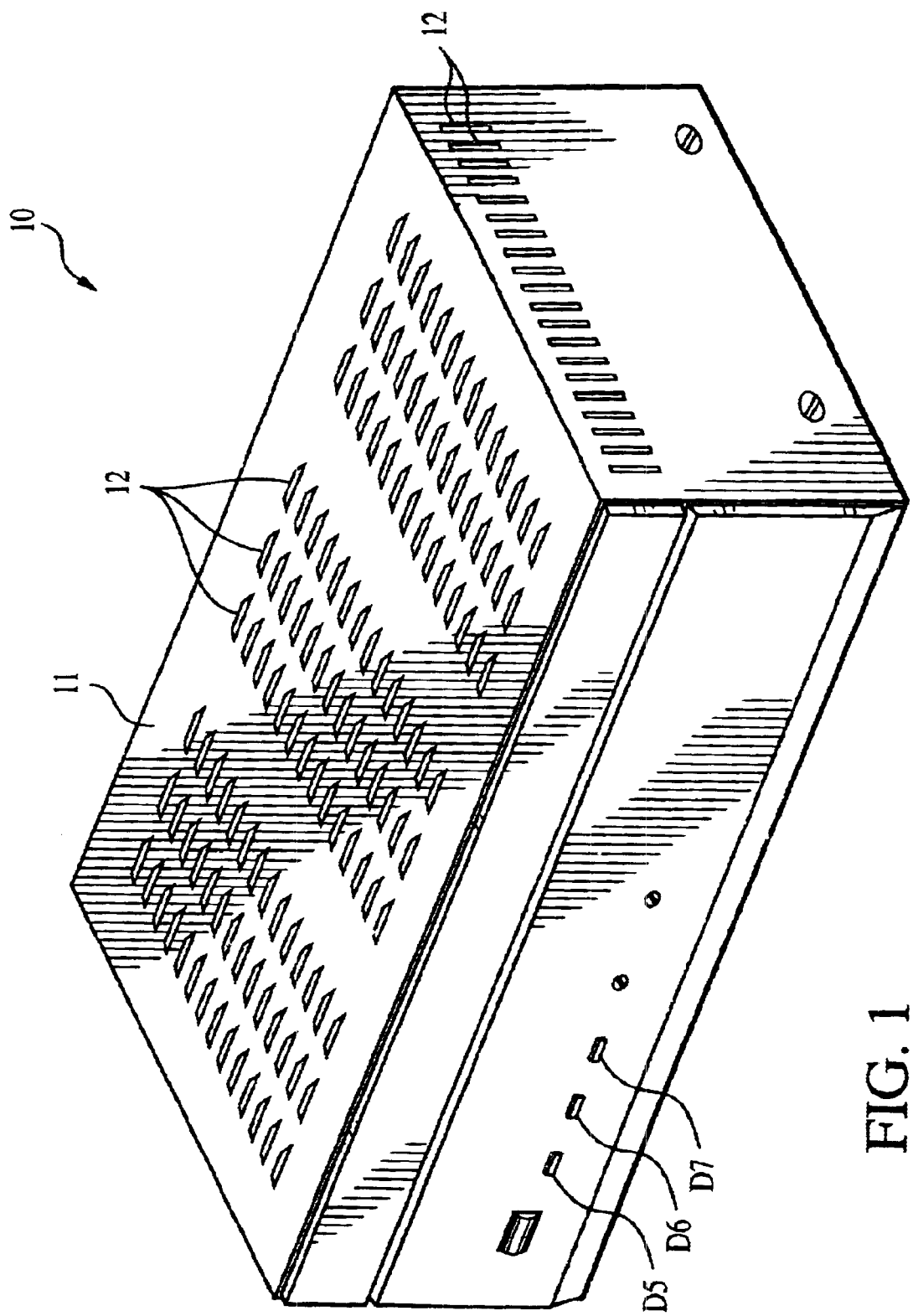
FIG. 1 is a perspective view of an audio amplifier having an audio amplifier controller with a soft start circuit according to the present invention.

FIG. 1 illustrates a perspective view of a power audio amplifier 10 having an audio amplifier power and temperature controller 20 according to the present invention (see also FIGS. 3A–3D). The audio amplifier 10 includes a housing 11 with a display 15 and a plurality of light indicators D5, D6, D7 on a front panel thereof and a plurality of vent openings 12 positioned in a top and side panels thereof. As perhaps best shown in FIGS. 2–3D, the audio amplifier power and temperature controller 20 preferably includes power source to an audio amplifier 10. The power receiving means is preferably provided by a power receiving circuit which includes a plurality of conductors P1, P2, P3, P4 positioned to receive power from a power cord, e.g., from an alternating current ("AC"), a power supply, and/or a power transformer as understood by those skilled in the art. The power receiving circuit can also include a power switch SW1 (preferably for the entire audio amplifier), or other power ON/OFF sensing circuitry, and additional ON/OFF switch circuitry, e.g., preferably resistors R4, R5 and diodes D8, D9, e.g., Schottky diodes, in a resistor-diode network with +5 volts and ground as illustrated (see FIG. 2). The power receiving circuit can also include a plurality of fuses F1, F2 connected to the conductors, a damping capacitor C9 connected to the conductors, and a main power transformer T1 connected to one of the fuses F1 and one of the conductors P3 for supplying power to the power condition switching control circuit as described further herein.

The audio amplifier power and thermal controller also preferably includes power condition switching control means responsive to the power receiving means for switching components of an audio amplifier during a plurality of power conditions. The power condition switching control means is preferably provided by a power condition switching control circuit which advantageously switchingly controls power from the power receiving circuit to other components of the audio amplifier, including any amplifying transistors associated with the audio amplifier 10. The control circuit is preferably responsive to power being supplied during start up and power being supplied during continuous operation of the amplifier 10. An example of such power condition switching control circuit is illustrated in FIGS. 3A–3D in conjunction with an audio amplifier circuit.

The power condition switching control circuit preferably includes soft starting means, e.g., preferably provided by a soft start circuit according to the present invention, responsive to the power receiving circuit for limiting inrush current from the power receiving circuit and for slowly ramping up to an audio amplifier on-state. The soft starting circuit advantageously includes a power level detection circuit to detect voltage changes by sensing frequency changes and voltage null points and a micro-controller U3, such as P1C16C505, responsive to the power level detection circuit to monitor low power conditions and high power conditions. Although particularly advantageous for amplifiers, and more particularly audio power amplifiers, the soft start circuit can also advantageously be used in other AC start up circuit applications. The micro-controller U3, for example, preferably includes wave analyzing means, e.g., a software program in the micro-controller U3, for analyzing the sinusoidal waves, i.e., AC, detected by the power level detection circuit to determine a voltage null so that the soft start function allows the audio amplifier to turn on just prior of a voltage null and to gradually ramp up to a fully on-start or high power condition. By analyzing the frequency of the waves, the wave analyzer, for example, can use the elongation of the step function to indicate a higher voltage.

Figure 2:
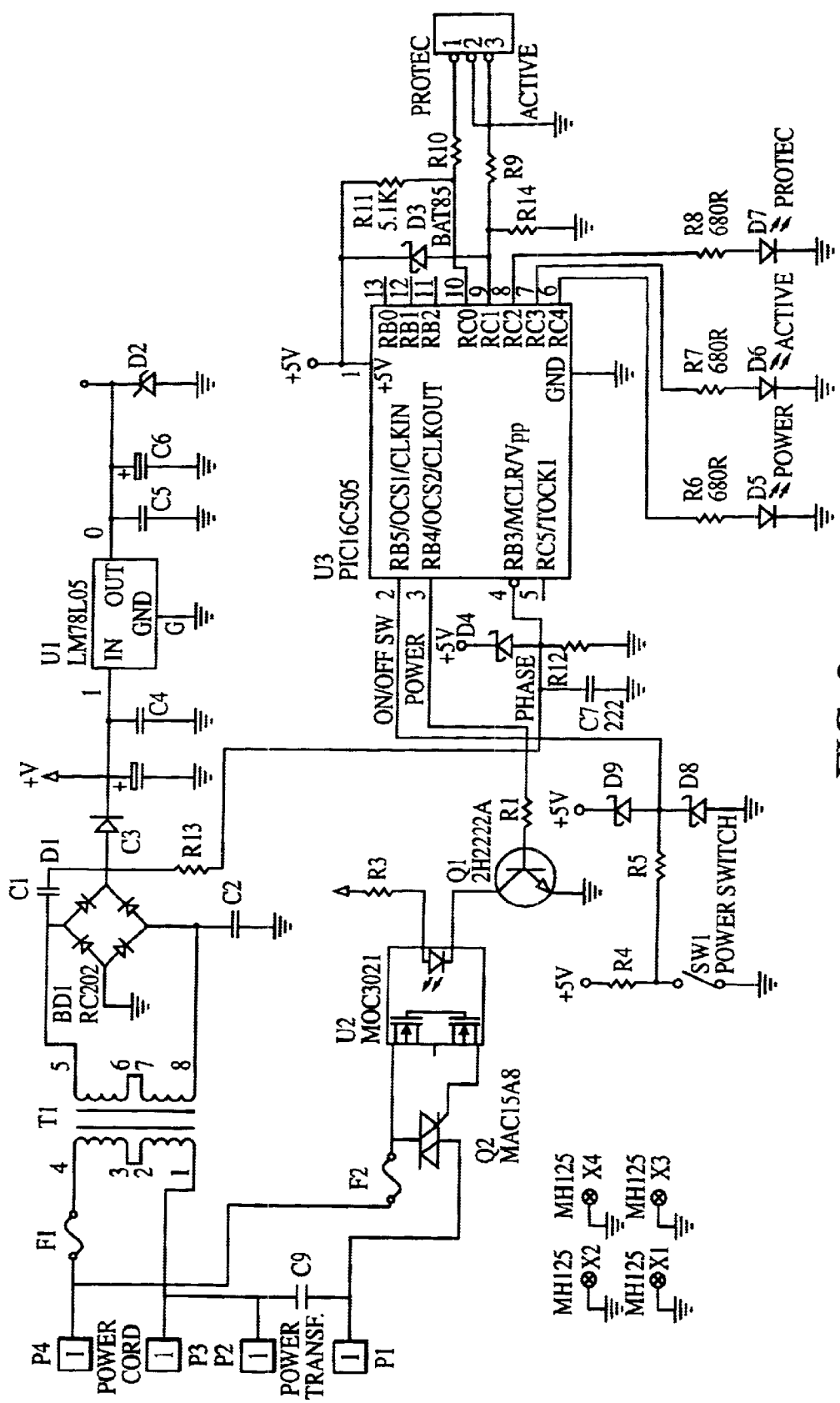
FIG. 2 is a schematic circuit diagram of an audio amplifier controller according to a first embodiment of the present invention.

As shown in FIG. 2, for example, the soft start circuit can also include a voltage regulating circuit connected to a voltage supply, e.g., +5 volts, which regulates input voltage to the soft start circuit. The voltage regulating circuit can include a voltage regulator and one or more Zener or other diodes and capacitors connected to power and ground. A diode D1 can also be used for isolation of the AC signal. A bridge rectifier connected to the power transformer, a capacitor connected to ground, and a capacitor is positioned to rectify the voltage from the power transformer. A plurality of resistors, a capacitor, and a diode, e.g., a Schottky diode, are also connected to the capacitor in a network arrangement as illustrated and the +5 volts source, ground, and a pin (Pin 4) of the micro-controller.

The power level detection circuit is preferably provided by a power triac or other similar circuit which tracks or detects when alternating current ("AC") power is low at the end of a cycle to limit inverse current. A optocoupler or optoisolater provides optical isolation between the power receiving circuit and the transistor, as well as resistors to indicate power status to the micro-controller at a pin (Pin3) thereof.

Figure 6:
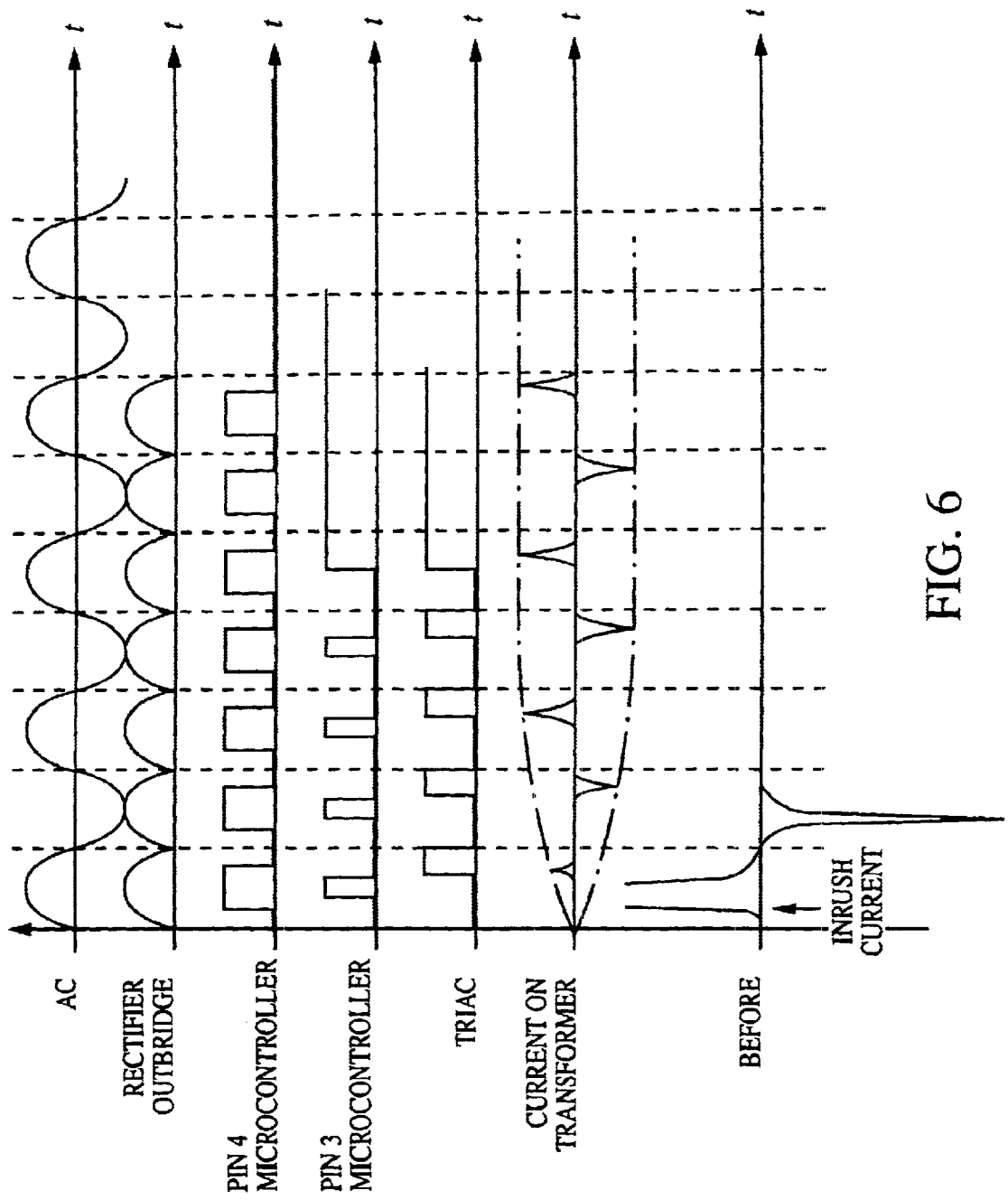
FIG. 6 is a graph of timing diagrams for methods of controlling an audio amplifier according to the present invention.
Figure 7:
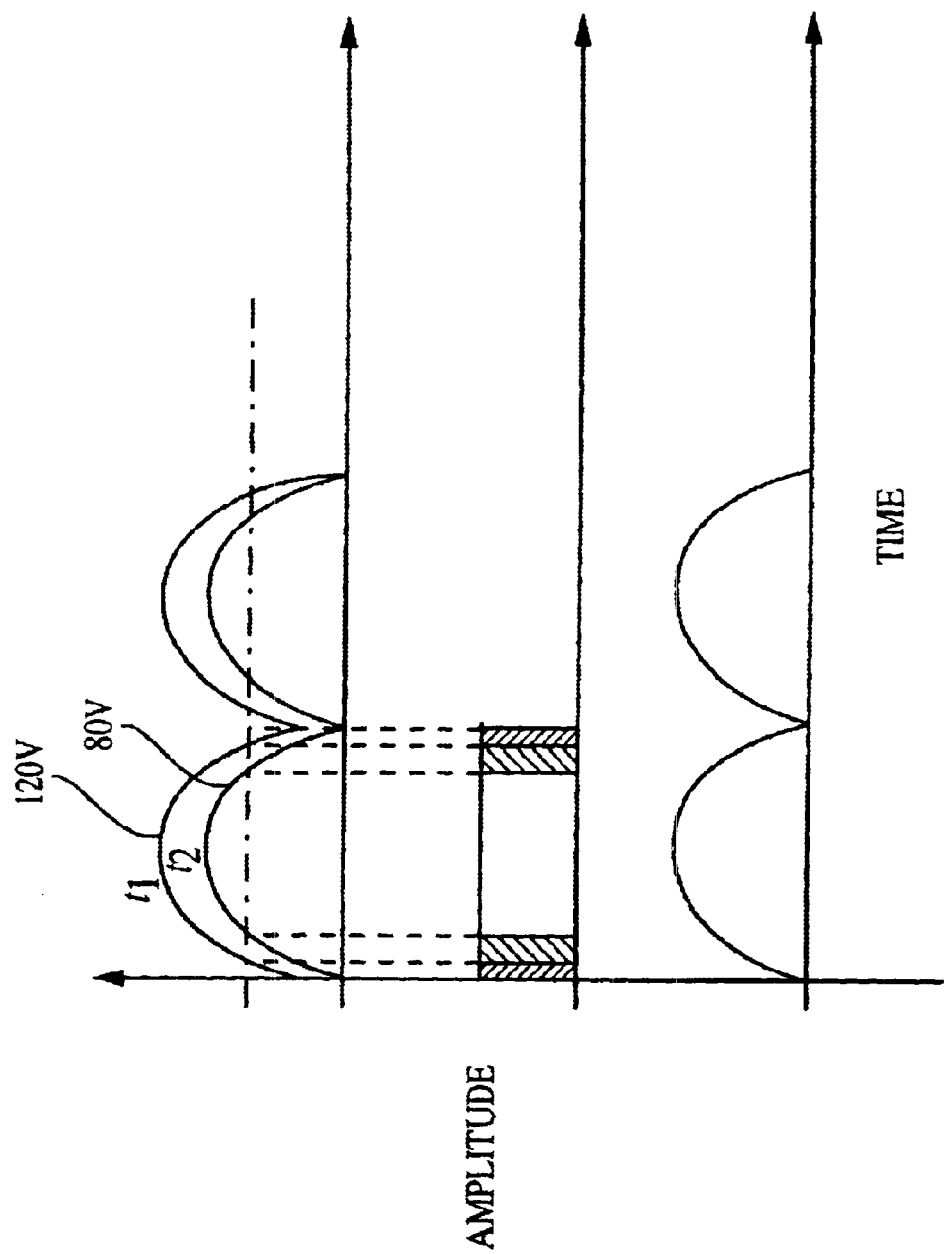
FIG. 7 is a graph of amplitude versus time for methods of controlling an audio amplifier according to the present invention.

The micro-controller of the soft starting circuit receives an analog signal as an input to Pin 4. This signal is processed in the micro-controller without utilization of an external or internal analog to digital converter ("ADC") as understood by those skilled in the art. Instead, this is accomplished by taking advantage of the characteristics of a micro-controller, e.g., formed of silicon CMOS. As perhaps best shown in FIGS. 2 and 6, the AC signal from the diode bridge rectifier is delivered to Pin 4 in analog form. The software programs embedded or stored in the micro-controller to assign a digital value to each timed portion of the input analog signal (timing is referenced to the micro-controller internal clock as understood by those skilled in the art). The software of the micro-controller can also be written to accomplish frequency, amplitude, and input AC voltage "null to null" timing based on a digital replica made of the analog signal input at Pin 4. The software program is preferably written in such a manner to be independent of micro-controller device technology. In other words, gallium arsenide (GaAs), silicon germanium (SiGe), or silicon carbide (SiC) based micro-controllers, for example, will also function accurately in this circuit without the use of external or internal ADC using such software capabilities.

The power condition switching control circuit also preferably includes thermal status monitoring and controlling means for monitoring thermal status of operating values of audio amplifier components and responsively decreasing power to the audio amplifier components against damage caused by excess heat and for responsively increasing power when the audio amplifier components return to normal thermal operating conditions. The thermal status monitor and controlling means is preferably provided by a thermal status monitoring and controlling circuit which can be provided by the micro-controller and software programs stored or embedded therein, as described further herein with reference to FIGS. 4A–5G.

Output monitoring means of the power condition switching control circuit is also provided for monitoring current output circuits of the audio amplifier 10 to protect the amplifier during a high current condition, e.g., transients or electro-static discharge, when connected to the audio amplifier by disconnecting a load to the current output circuits and reconnecting the load to the current output circuits when normal operating current conditions resume. The output monitoring means includes means for monitoring the output current circuits to determine if full audio amplifier shut down is desirable to protect the audio amplifier 10 and speakers or other audio system components when connected thereto. The output monitoring circuit, for example, can include a connector for connecting the power condition switching control circuit to an input circuit of the power amplifier, and a resistor and diode network connected to the connector and the micro-controller, as well as ground and power, e.g., +5 volts. The micro-controller and software programs embedded or stored therein also can form a portion of the output current monitoring circuit as described with references to FIGS. 4A–5G herein.

The power condition switching control means further includes input power discriminating means responsive to the power receiving means for discriminating between incoming audio component signals to switch the audio amplifier 10 to the on-state. The input power discriminating means is preferably provided by a power discriminating circuit. The power condition switching control means also further includes brown-out protecting means for protectively preventing the audio amplifier 10 from going into and remaining in a circuit protection or sleep mode by continuously monitoring the audio amplifier 10 for normal current conditions and responsively resuming normal current amplifier operations when normal current conditions occur. The brown-out protecting means is also provided by a brown-out protecting circuit. Both the discriminating circuit and brown-out detection circuit are preferably provided by the micro-controller and software programs stored therein, and as further described with respect to FIGS. 4A–5G.

The audio amplifier power and thermal controller can also advantageously include visual feedback means responsive to the power condition switching control means for providing visual operating and error status conditions. The visual feedback means includes indicating means, e.g., preferably provided by a software program in a micro-controller and/or as a separate hardware circuitry, e.g., resistors, for indicating at least one predetermined visual signal and a plurality of light sources, e.g., light emitting diodes ("LEDs"), responsive to the indicating means to visually display light representing the at least one predetermined visual signal.

FIGS. 3A–3D illustrate an audio amplifier having another embodiment of a power and thermal controller of the present invention. These figures illustrate the amplifiers on the left and right channels in FIGS. 3A–3B (see also connection of FIG. 3D). These amplification circuits are substantially the same for each channel and are connected by a connector bridge and a resistor. Each amplification circuit includes a switching or logic circuits, a plurality of transistors, a resistor, capacitor, and diode network having a plurality of capacitors, a plurality of resistors, and a plurality of diodes. These circuits serve primarily the amplification function of the audio amplifier. The amplification circuits can also include the circuits shown in FIG. 3B which are also substantially similar and include logic or switching interface circuits, resistors, capacitors, fuses, and bridging circuits.

Figure 3A:
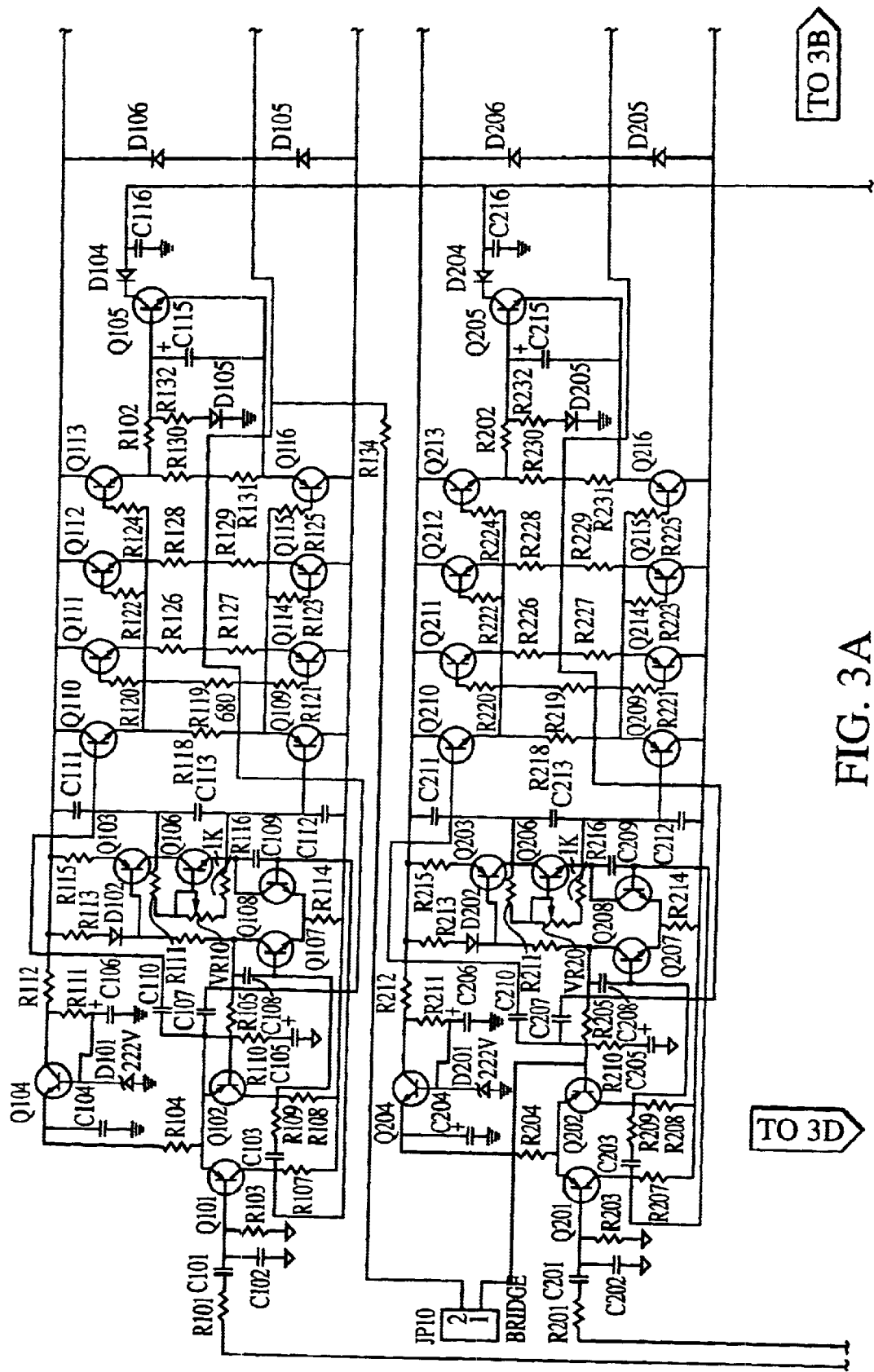
FIGS. 3A–3D are schematic circuit diagrams of an audio amplifier controller according to a second embodiment of the present invention.
Figure 3B:
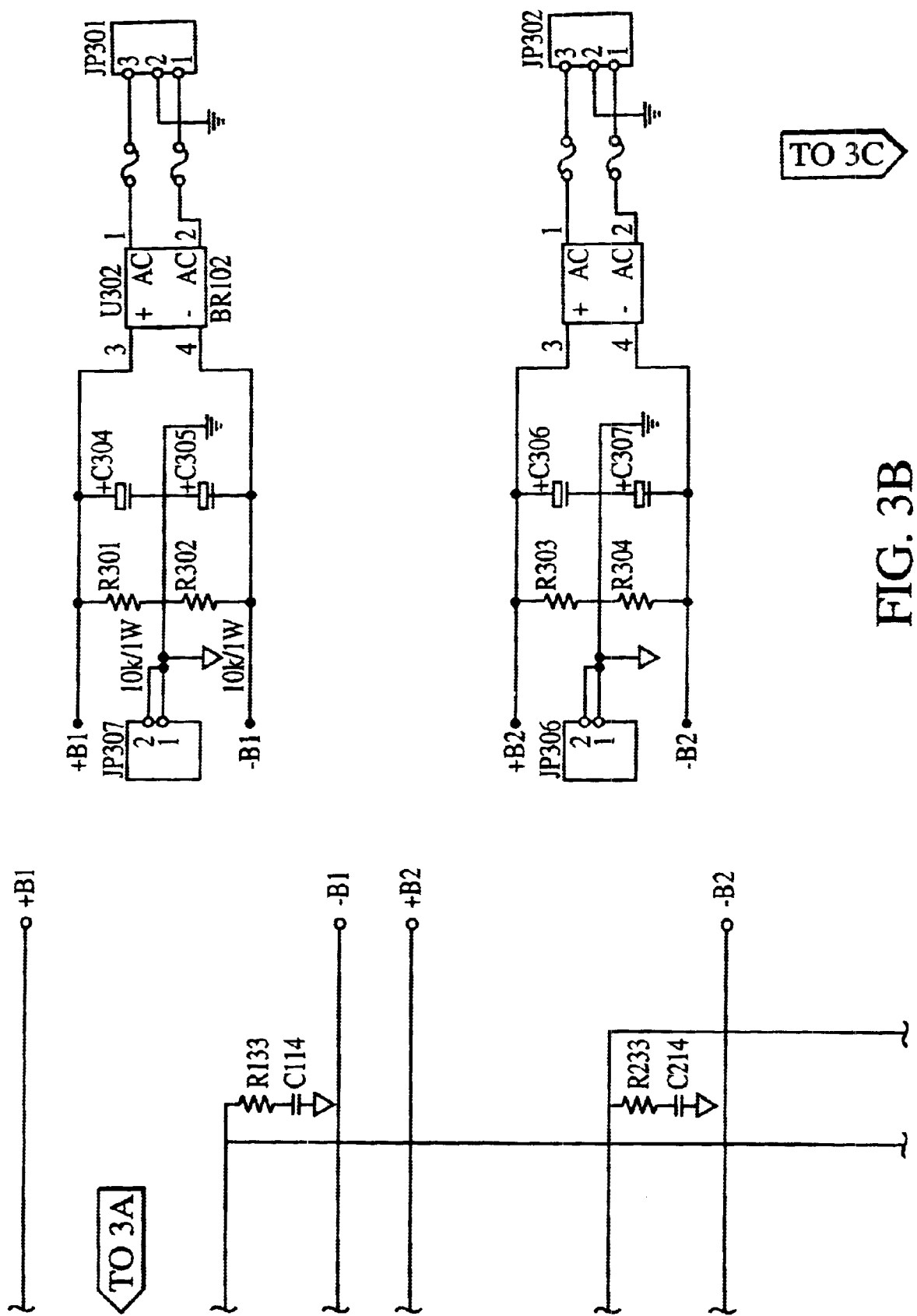
Figure 3C:
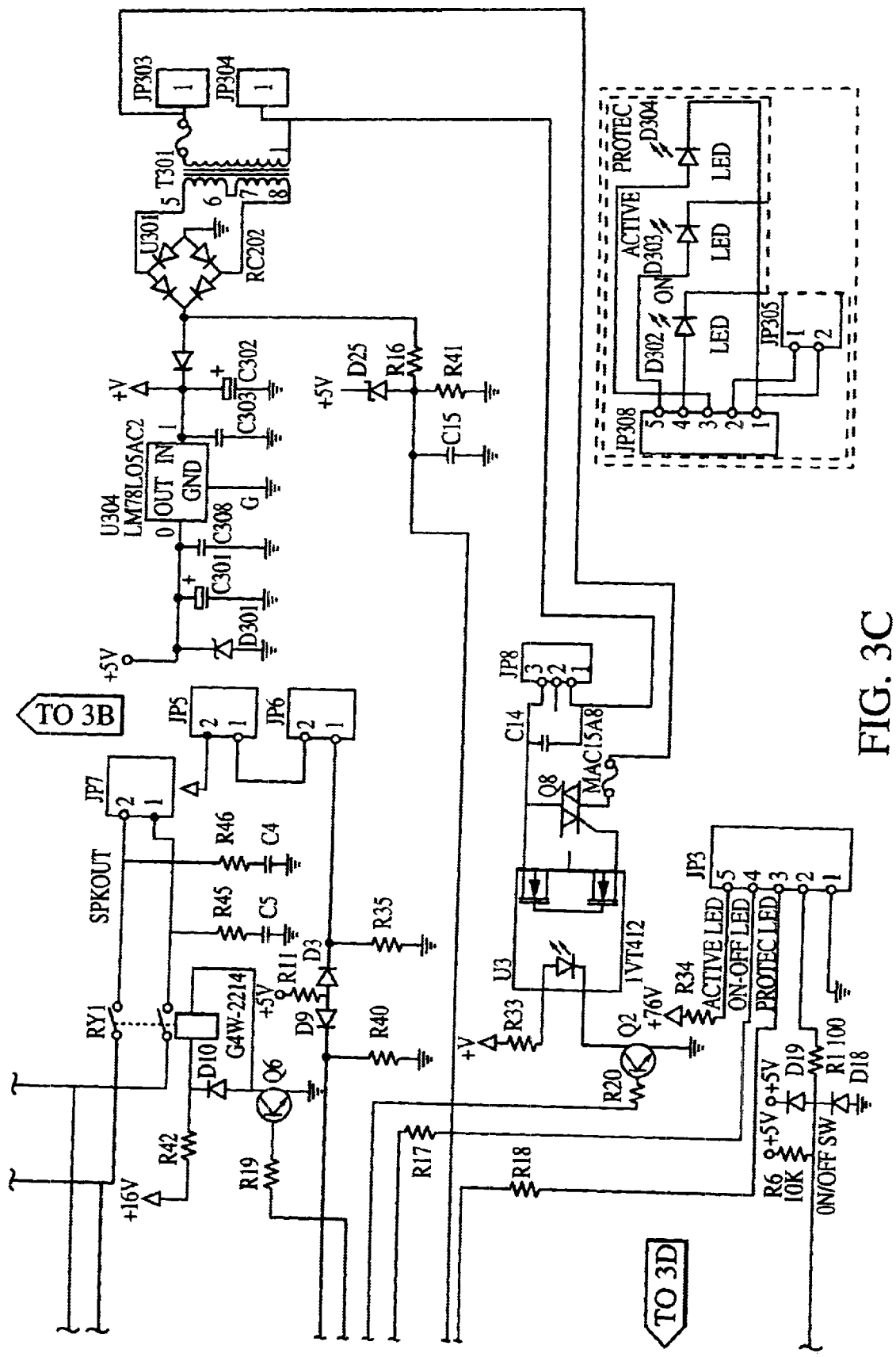
Figure 3D:
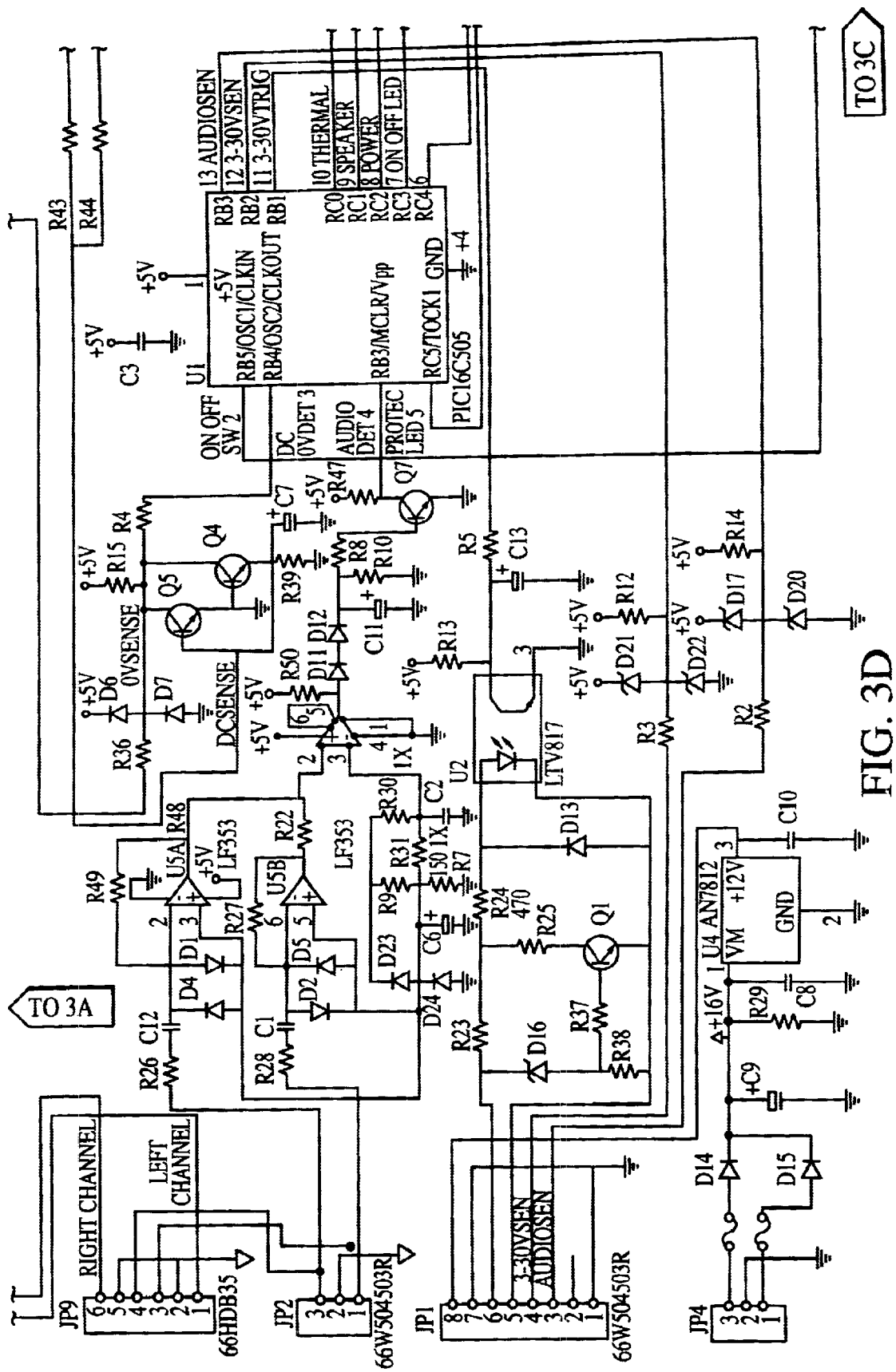

FIGS. 3C and 3D illustrate another embodiment of the power condition switching control circuit. This circuit likewise includes a main power transformer, a bridge rectifier, a triac, an optocoupler or optoisolator, a micro-controller, and fuses, similar to the first embodiment described above. Logic or switching interface circuits are also connected thereto. The output from the bridge rectifier likewise had diode, resistors, and capacitor network connected to the bridge rectifier and Pin 6 of the micro-controller.

The thermal monitoring circuit is provided by portions of the micro-controller and the diode and resistor circuit and logic or switching interface circuits. The power receiving circuit can also include the ON/OFF switch, the diodes and resistors connected thereto, to Pin 2 of the micro-controller, and to the logic circuit. The logic or switching interface circuit also has resistors connected thereto and to Pins 6 and 7 of the micro-controller. The soft starting portion of the circuit also has resistors, transistor, capacitor, and logic circuit connected thereto as illustrated. Likewise, the circuit also has a voltage regulator and a diode and a plurality of capacitors connected thereto. A diode also is positioned to isolate an AC signal and is connected to the bridge rectifier as illustrated.

As perhaps best illustrated in FIGS. 3C–3D, the power condition switching control circuit or connector for sensing audio at Pin 13 of the micro-controller, resistor, and the logic circuit. A 3–30 volt range function circuit is also provided at Pin 12 of the micro-controller, resistor, and logic circuit. An audio detect circuit is provided connected to Pin 4 of the micro-controller and have a switching or logic circuit connected thereto. The audio detect circuit includes a transistor, a plurality of diodes connected in a network. The audio detect circuit also includes a plurality of amplifiers in a stage arrangement as illustrated.

Also, a direct current or over current detect circuit is provided connected to Pin 3 of the micro-controller and has a plurality of resistors, a plurality of diodes, and a capacitor positioned to a ground connection. The circuit also connects to a relay, or switch, to the speaker output at logic or switching circuit and resistors and capacitors. The speaker circuit is also connected to Pin 9 of the micro-controller and has a transistor, a plurality of resistors and a diode connected thereto.

Further, the audio sense and 3–30 volt range function detect circuits can have a circuit connected to the logic or switching interface circuit. This circuit includes a logic or switching interface circuit, a pair of fuses, a pair of diodes, a plurality of capacitors, a resistor, and a voltage regulator.

Figure 4A:
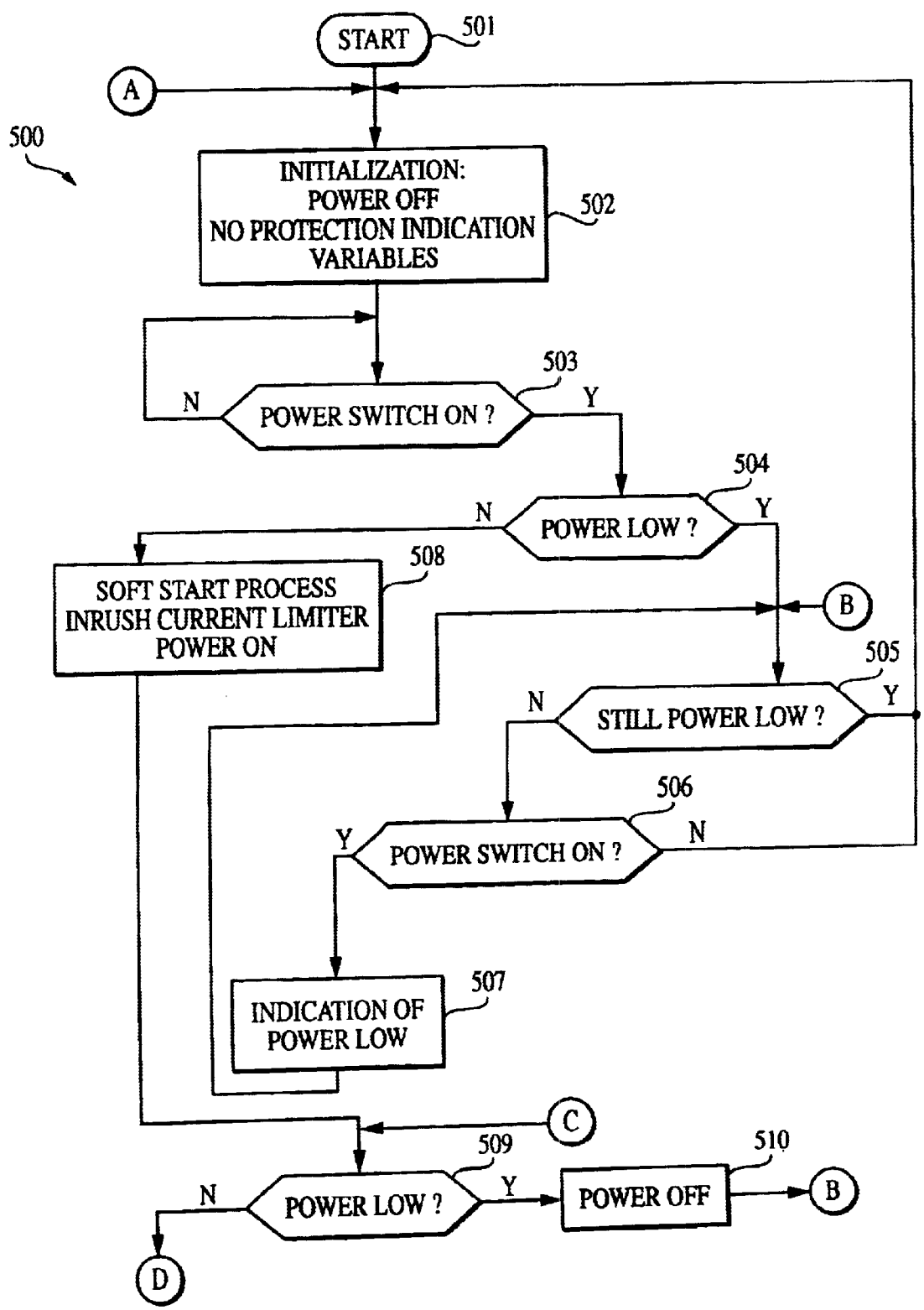
FIGS. 4A–4B are schematic flow diagrams of a method of controlling an audio amplifier according to a first embodiment of the present invention.
Figure 4B:
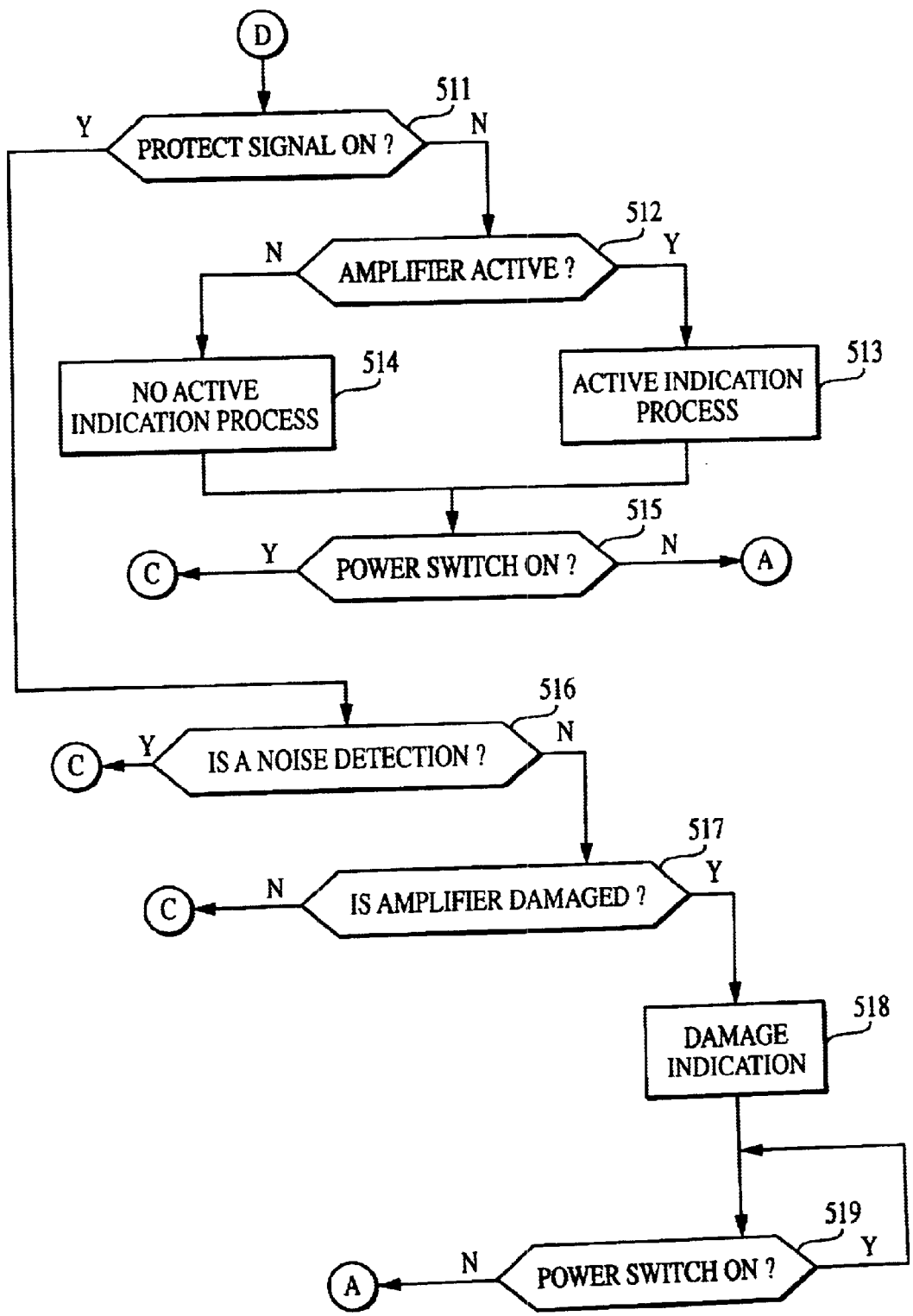

FIGS. 4A and 4B are schematic flow diagrams of portions of the power condition switching control circuit illustrating the soft start method or process of the present invention. The method includes starting the process by initialization where the power is off and no protection indication variables are required internal to the micro-controller. The next step is to check whether the power switch is turned on (see pin 2 of micro-controller). If not, then a loop back to this step continues. If the power switch is turned on, however, a determination is made as to whether the power is low (see Pin 4 of micro-controller) such as in a brown-out condition. The threshold level, for example, can be 2 volts. If the power is low, then a determination is made as to whether this was a false signal or a power problem exists. If so, then initialization can reoccur or a determination made as to whether the power switch is really on or still on. If the power switch is still on after a selected lapsed time, a power low indication can be made to a user or technician so that the user or technician can check the power status of power being supplied to the audio amplifier controller and audio amplifier and the amplifier will not be turned on.

If, on the other hand, the power is not low, e.g., below a predetermined threshold, then the soft start process is started to limit the inrush current. The controller monitors the soft start process to make sure that a low power condition has not arisen. If so, then a determination is made as to whether the power is off. If there is a preliminary indication, then a time period elapses to verify this determination. The process returns to verify that the power is still low and that cycle continues as described above.

If the power is not low (see FIG. 4B), however, then a circuit protect process is initiated to protect the output of the output circuits (see Pin 10 of micro-controller) during high current conditions. The protect signal is not initiated for some reason, then a determination is made as to whether the amplifier is in a sleep mode or not. If the amplifier is active, then an active indication process is initiated, and a determination as to whether the power switch is still on is made. If the amplifier is not active, then a no active indication process is initiated, and a determination as to whether the power switch is on is also made.

If the protect signal is on, then a determination is made as to whether the signal was noise such as a longer transient spike or a real power on signal. If it was noise, then a determination is made as to whether power is low to verify this determination, and the process continues. If it was not noise, then a determination is made as to whether the amplifier is damaged is made. If not, then a determination of whether power is low now is made. If the amplifier has been damaged, then a damage signal or indication is made, e.g., requesting that a user or technician turn off the amplifier. The process would then check to see if the power switch is still on. If so, the damage indication would continue. If not, then the process returns to the initialization (see FIG. 4A).

FIGS. 5A through 5G illustrates an additional embodiment and further aspects of a power condition switching control circuit. These schematic flow diagrams of portions of the power condition switching control circuit illustrate the methods and processes of the structure as described above herein. The method or process of the present invention preferably starts by initialization where the amplifier power indication is off and the amplifier is mute. A determination is then made as whether the power switch is on or detected as being in an on position. If the switch is not on, then a continuous wait to see if the switch is turned on occurs. If the switch is on, then a determination of whether the power is below a predetermined threshold or at an AC brown-out level is made. If so, then a determination is made as to whether the amplifier is off or mute is made and whether an AC brown-out is still occurring. If the amplifier is off or not brown-out condition is detected, then an indication of an AC brown-out level occurs.

If the power is not low or no brown-out condition is detected, then power on indication occurs. If the power switch is not on or turned off, then initialization reoccurs. If the power switch is still on, then a determination is made as to whether an audio sense function is on. If the function is not on, then a determination is made as to whether a 3–30 volt range function is on. If the 3–30 volt range function is on, then a determination is made as to whether the amplifier is active (see FIG. 5B).

If the amplifier is active, then an AC brown out level determination is made, and the process as described above at is repeated (see FIG. 5A). If the amplifier is not active, then the soft start process is initiated by limiting the inrush current to slowly turn the amplifier on or to an active state with the amplifier mute function in an off-position. A determination is then made as to whether the direct current or over current signal is on. If not, then a determination is made as to whether the power switch is still on. If not, then initialization reoccurs. If so, then whether the audio sense function is not on, then a brown-out level determination is made again (see also FIG. 5A).

If, on the other hand, the audio sense function is on, then a determination is made as to whether the amplifier is active. If the amplifier is not active, then the amplifier is off and/or amplifier mute may be on. A determination is made as to whether the audio signal is on. If not, then a determination is made at to whether the power switch is on again (see FIG. 5A). If the audio signal is on, however, then the soft start process is initiated to limit the inrush current and slowly ramp up to an amplifier on-state with the amplifier mute in an off position and the amplifier active. If the amplifier is active, then a determination is made as to whether the audio signal is on. If the audio signal is on, then a determination is made as to whether the power switch is still on. If not, then initialization reoccurs. If so, however, then a determination is made as to whether a direct current or over current signal is on. If not, then a determination is made about the thermal signal. If the thermal signal is not on, e.g., no overheat condition, then a determination is made as to whether the audio sense function is on. If not, the process of step is repeated (see FIG. 5C). If so, then a brown-out level is determined. If a brown-out condition is detected, then the process returns to step (see FIG. 5A). If no brown-out condition is detected, then the process returns to the audio signal on determination and the process repeated.

If, however, the 3–30 volt range function is on (see FIG. 5D), then a determination is made as to whether the amplifier is active. If so, then the 3–30 voltage range function signal is determined to be on or not. If the amplifier is not active, then the amplifier is off and/or the amplifier mute is on. Then a determination is made as to whether the 3–30 voltage signal is on. If not, then a determination is made again on whether the power switch is on (see FIG. 5A). If the signal is on, however, then the soft start process to limit the inrush current and slowly ramp the current up to an amplifier on-state is initiated. The amplifier mute is then off and the amplifier is active.

A determination is then made as to whether the 3–30 volt range function signal is on. If not, then the process of step is repeated. If this function signal is on, then a determination is made again whether the power switch is still on. If not, then initiation is repeated. If the power switch is still on, then a direct current or overcurrent signal determination is made. If this signal is not on, then a thermal signal on condition is determined. If this signal is not on, then an audio sense function signal is determined. If this is on, then the process of step (see FIG. 5C) is repeated. If this audio sense function signal is not on, then the 3–30 volt range function signal is determined. If this is on, then a brown-out condition determination is repeated (see FIG. 5A). If this brown-out level is not occurring, then the process of step is repeated.

Figure 5A:
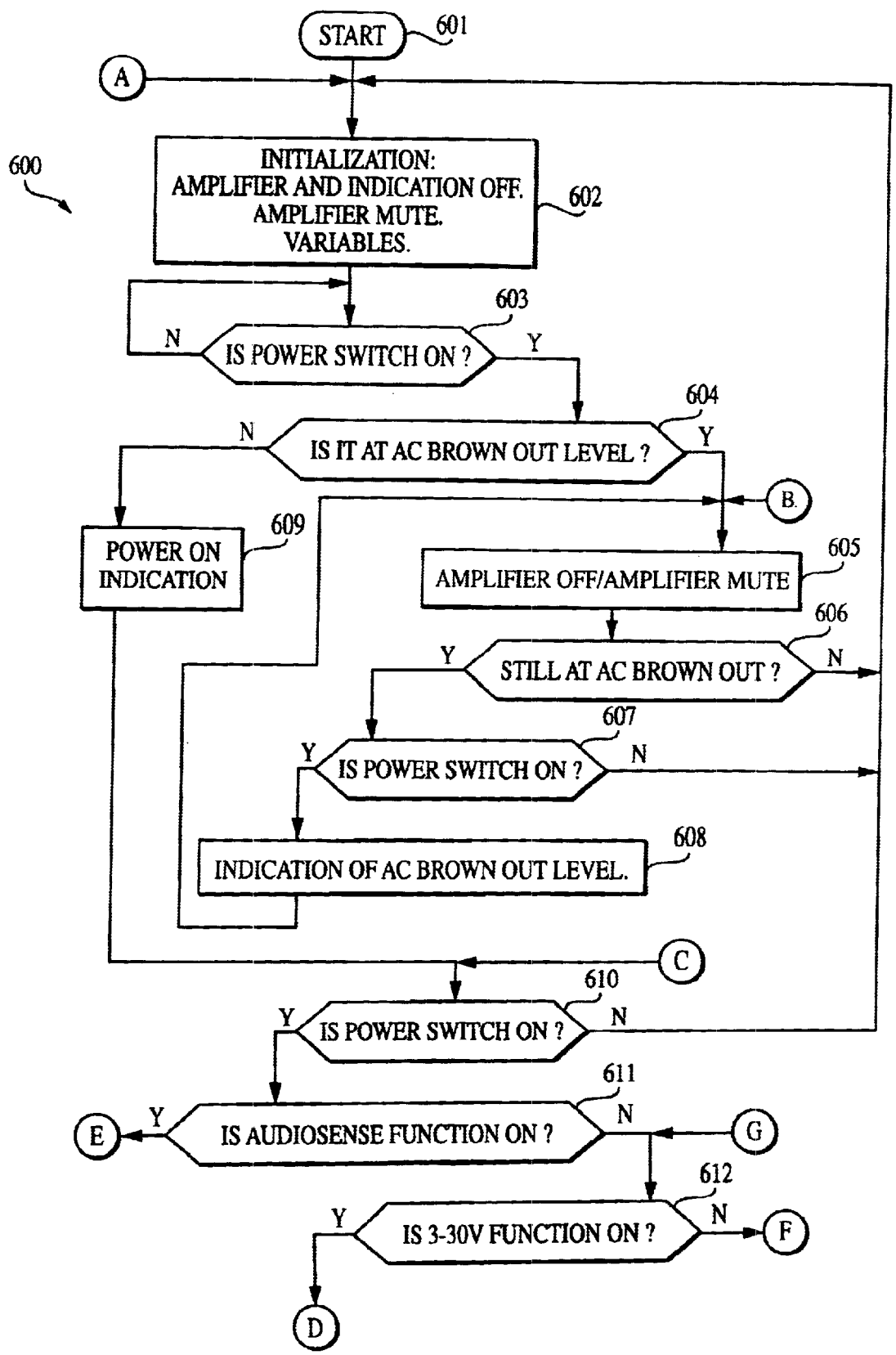
FIGS. 5A–5G are schematic flow diagrams of a method of controlling an audio amplifier according to a second embodiment of the present invention.
Figure 5B:
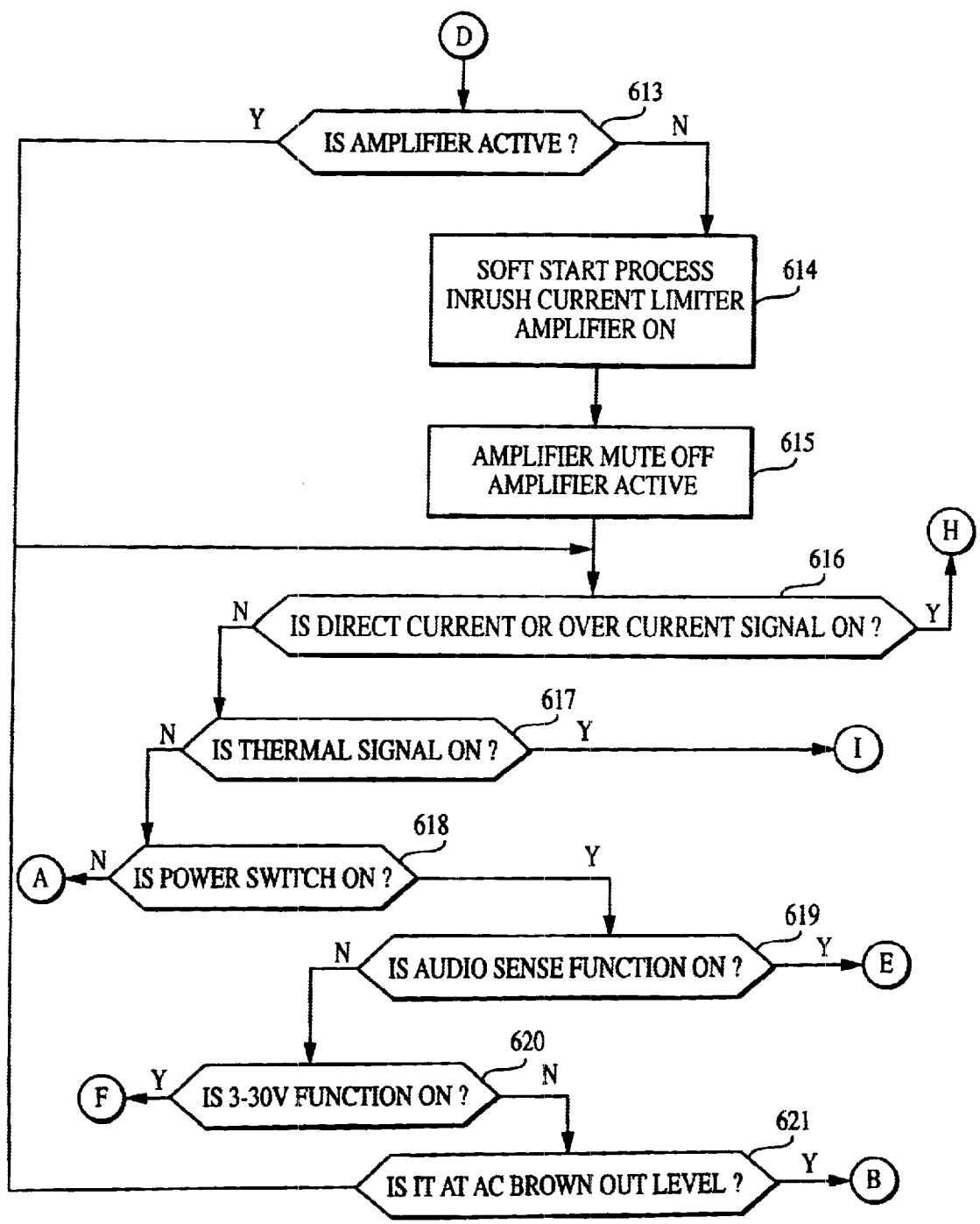
Figure 5C:
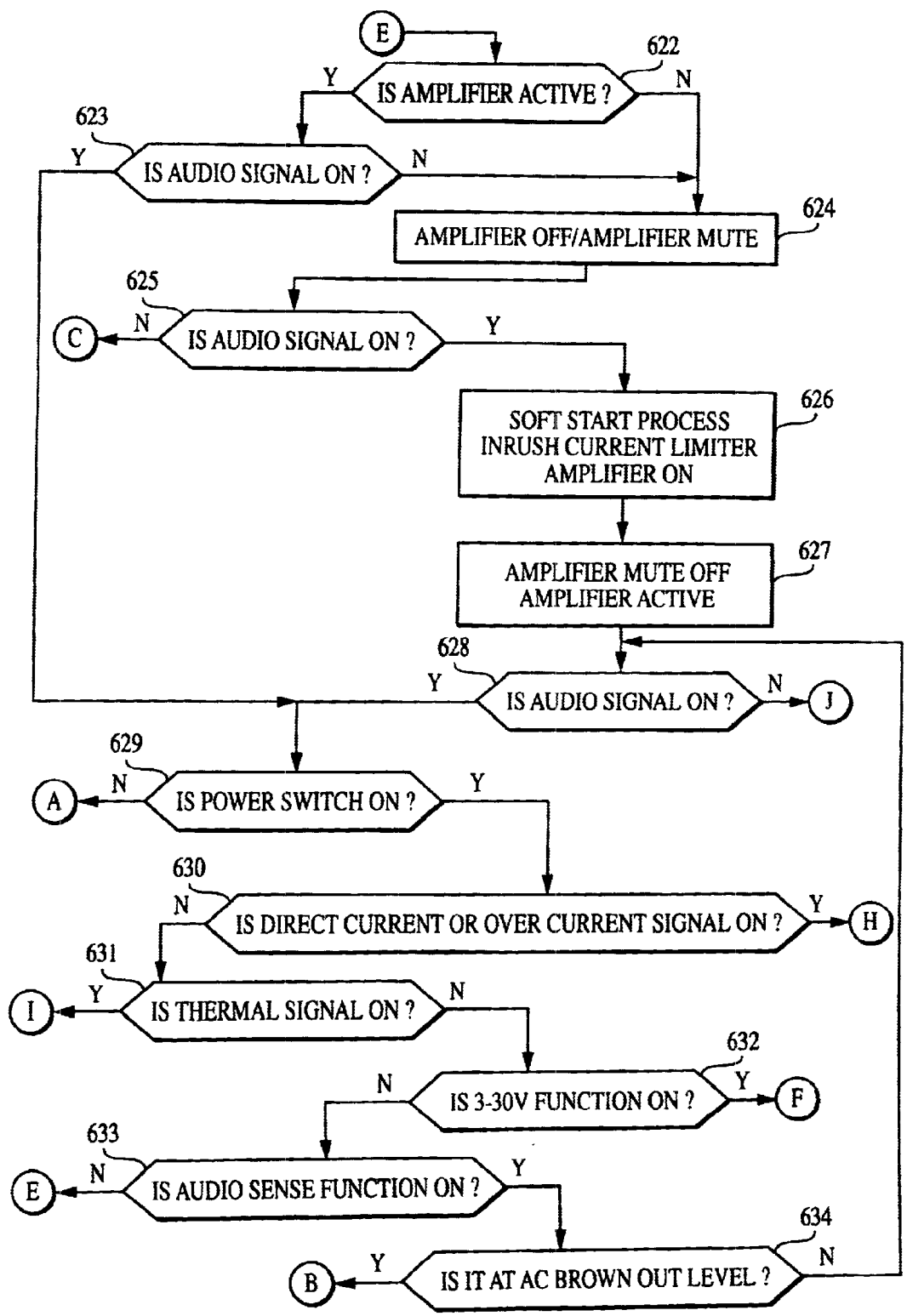
Figure 5D:
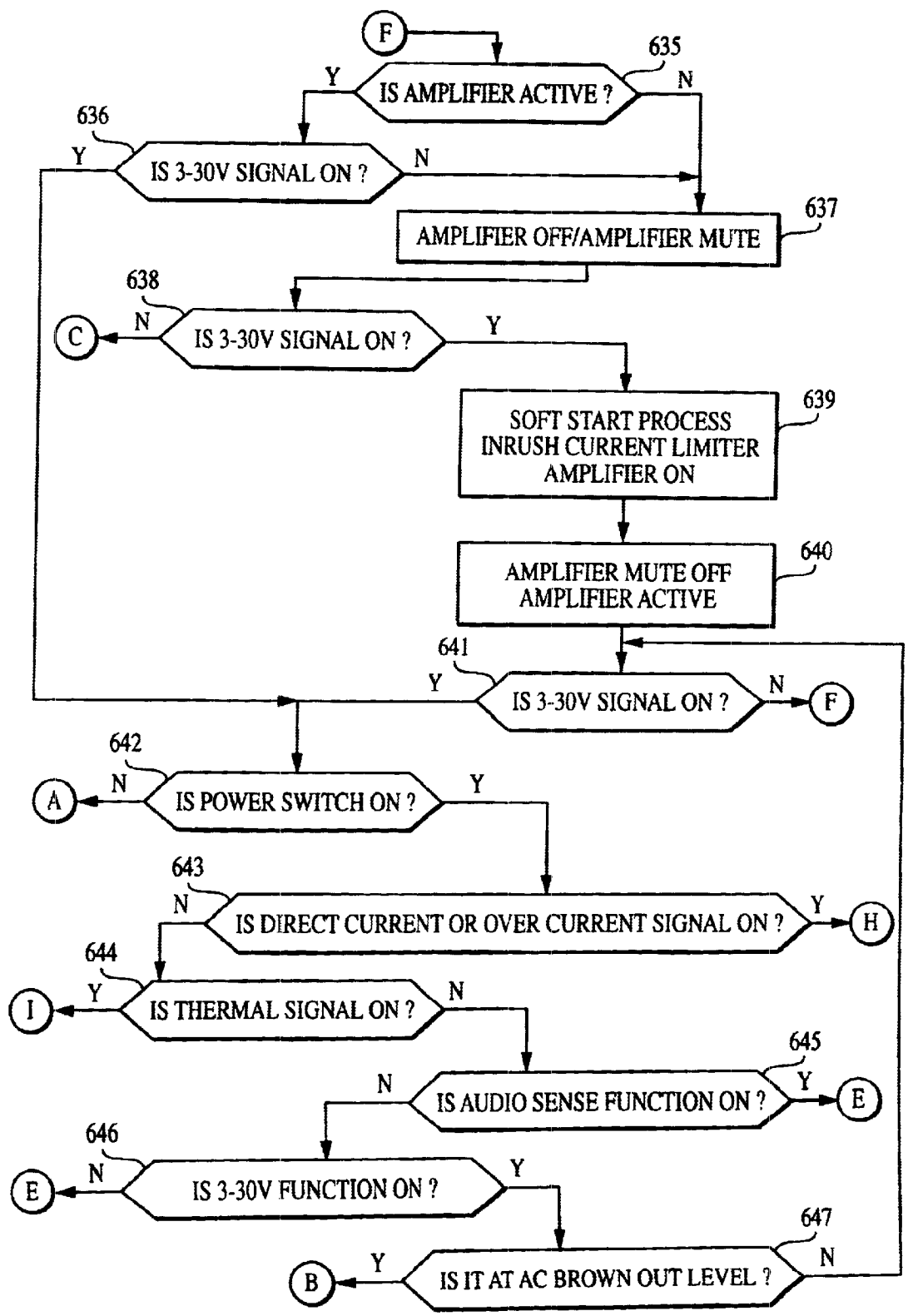
Figure 5E:
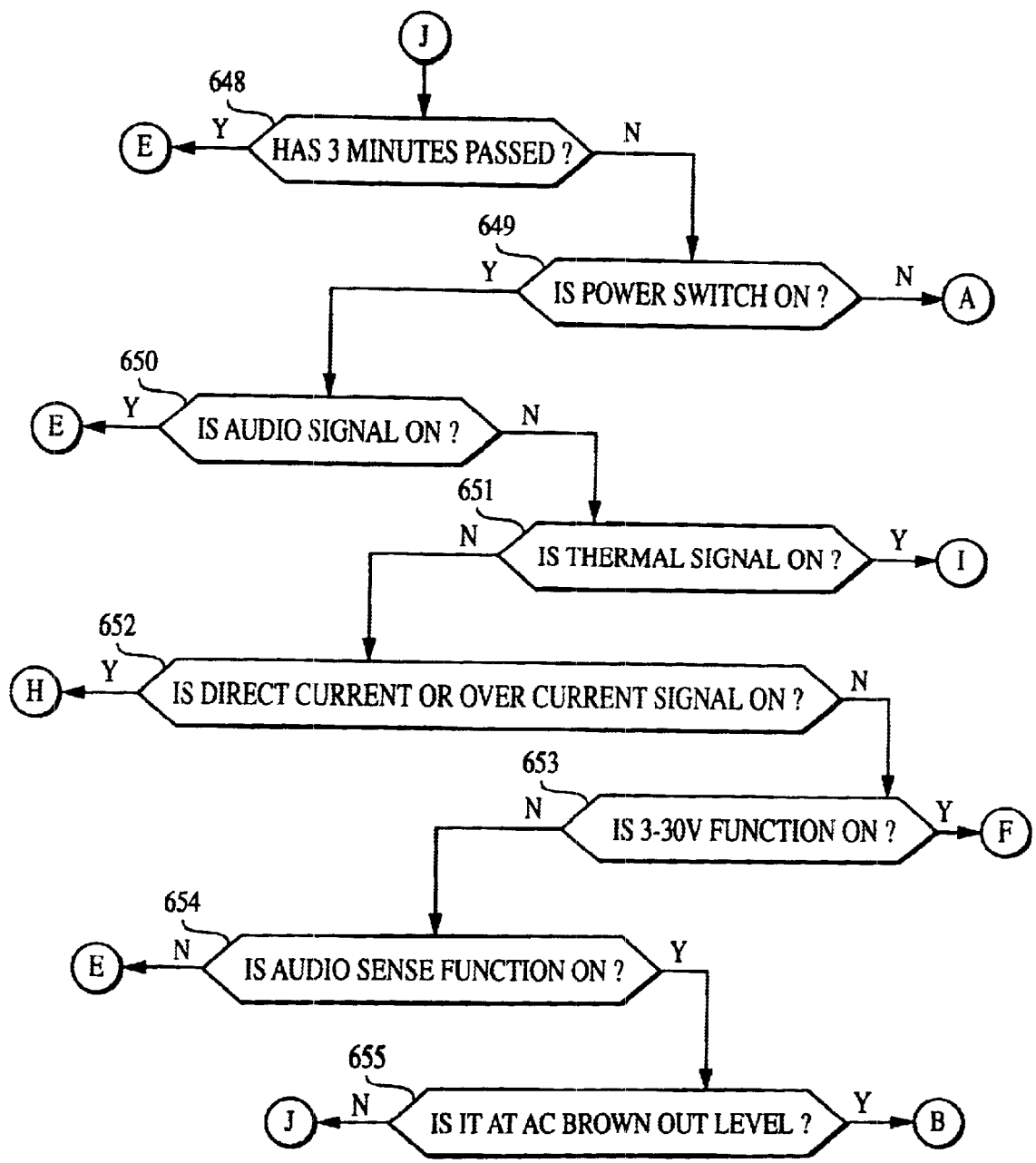

Now, as set forth in FIG. 5C, if the audio signal is not on, then a determination is made as to whether a predetermined time lapse or period, e.g., three minutes, occurs (see FIG. 5E). If it has occurred, then the process of step (see FIG. 5C) occurs. If this time period has not lapsed, then determinations are made as to whether the power switch is on, whether the audio signal is on, whether the thermal signal is on, whether the direct current or overcurrent signal is on, whether the 3–30 volt range function is on, whether the audio sense function is on, and whether a brown-out level occurs.

Figure 5F:
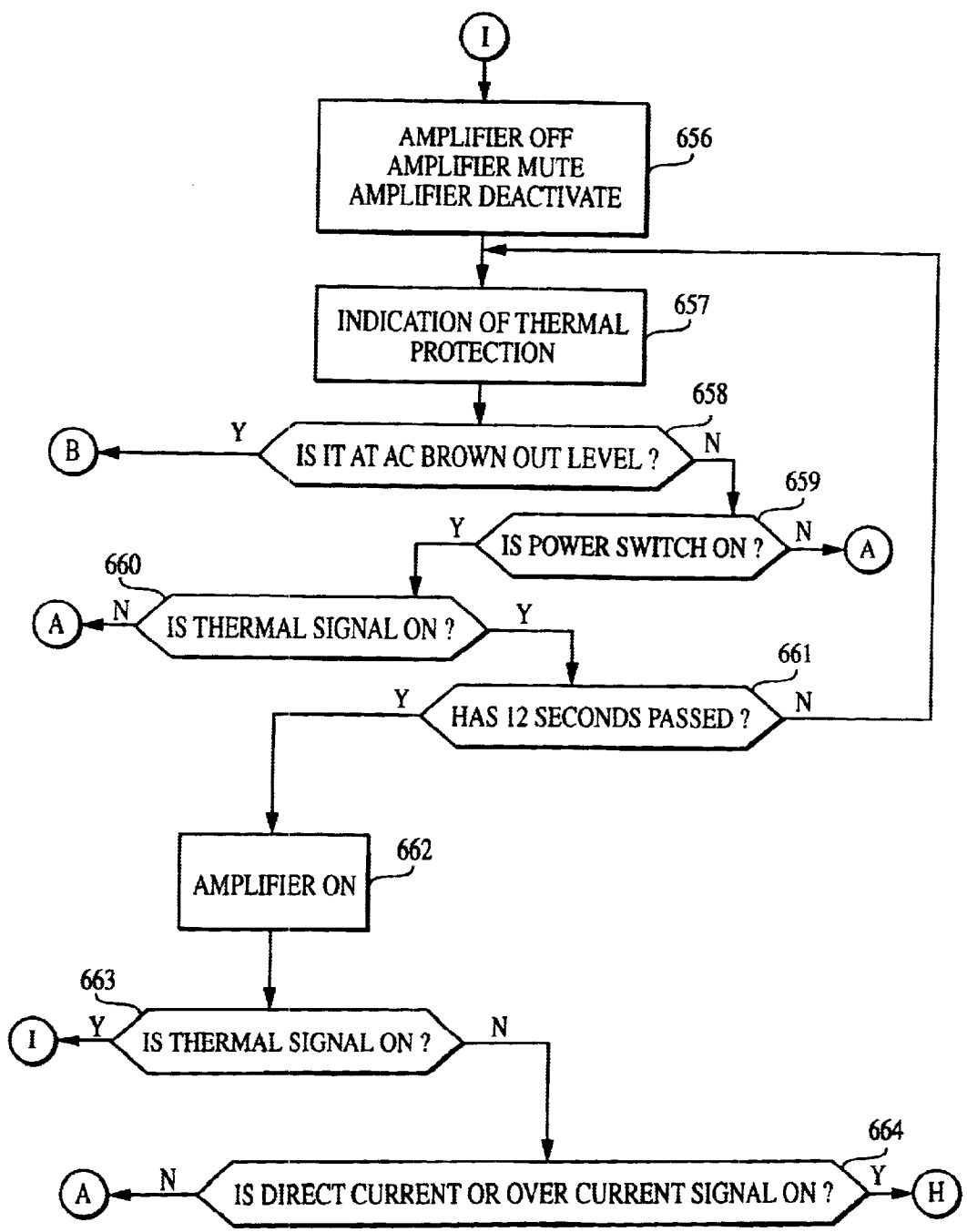

If the thermal signal is on, then the amplifier is turned off, muted and deactivated (see FIG. 5F). Thermal protection is also indicated. The controller then determines whether a brown-out level exists. If not, then determinations are made as to whether the power switch is on, the thermal signal is on, or has a predetermined time period, e.g., 12 seconds, passed. If the time period has not passed, then the thermal protection indication continues and the steps are repeated. If the period has passed, then the amplifier is turned on, and a determination of whether the thermal signal is still on is made. If so, then the process of step is repeated. If not, the direct current or overcurrent signal on condition is determined.

Figure 5G:
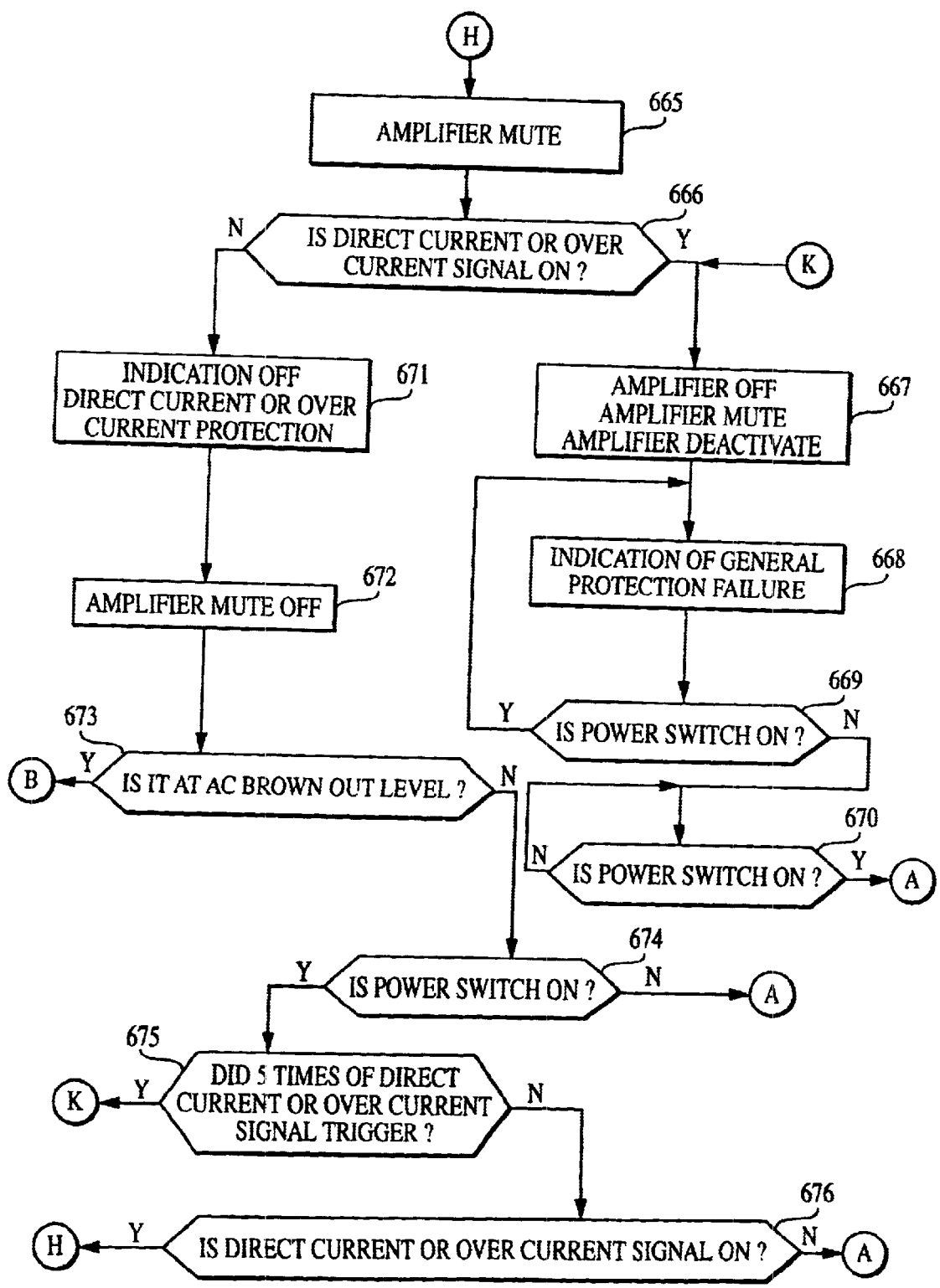

If the direct current or overcurrent signal is on, then the amplifier is muted (see FIG. 5G). The same direct or overcurrent signal condition is re-evaluated. If the signal is on, then the amplifier is on, muted, and deactivated and an indication or general protection failure occurs. A determination is made as to whether the power switch is still on repeatedly during this indication or until initialization (FIG. 5A). If the direct or overcurrent signal is not on, however, then the indication is off for direct current or overcurrent protection, the amplifier is mute, and a brown-out level can be determined. If the brown-out does not exist, then a power switch on determination is made again. If the power switch is on, then a determination is made as to whether a preselected number, e.g., five times, of direct current or overcurrent arise. If such a condition did arise, then the steps are repeated. If no condition did arise, then whether the direct current or overcurrent signal turn on is made again. If the signal is not on, then initialization occurs again. If it is on, then the process of step is repeated.

FIGS. 1–7b, and particularly FIGS. 4A–7, illustrate methods of controlling power to an audio amplifier. A method preferably includes receiving power from a power source to an audio amplifier and switching components of an audio amplifier during a plurality of power conditions. The step of switching components preferably includes limiting inrush current from the power source, slowly ramping up to an audio amplifier on-state, monitoring thermal status of operating values of audio amplifier components, responsively decreasing power to the audio amplifier components to protect the audio amplifier components against damage caused by excess heat, and responsively increasing power when the audio amplifier components return to normal thermal operating conditions.

The method can also advantageously include the step of switching components of an audio amplifier further including monitoring current output circuits of the audio amplifier to protect the audio amplifier during a high current condition when connected to the audio amplifier by disconnecting a load to the current output circuits and reconnecting the load to the current output circuits when normal operating current conditions resume, discriminating between incoming audio component signals to switch the audio amplifier to the on-state and transient line voltage to momentarily sense the signal but not activating the audio amplifier to the on-state, and protectively preventing the audio amplifier from going into and remaining in a circuit protection made by continuously monitoring the audio amplifier for normal current conditions and responsively resuming normal amplifier operations when normal current conditions occur.

The method can additionally include the step of limiting inrush current including detecting voltage changes by sensing frequency changes and voltage null points and monitoring low power conditions and high power conditions, and the step of monitoring further including monitoring the output current circuits to determine if full audio amplifier shut down is desirable to protect the audio amplifier and other system components when connected thereto. The method can further include providing visual operating and error status feedback for enhancing diagnosis of operating and error status conditions. The step of providing operating and error status feedback can include indicating at least one predetermined visual signal and displaying through a plurality of light sources light representing the at least one predetermined visual signal.

Figure 8:
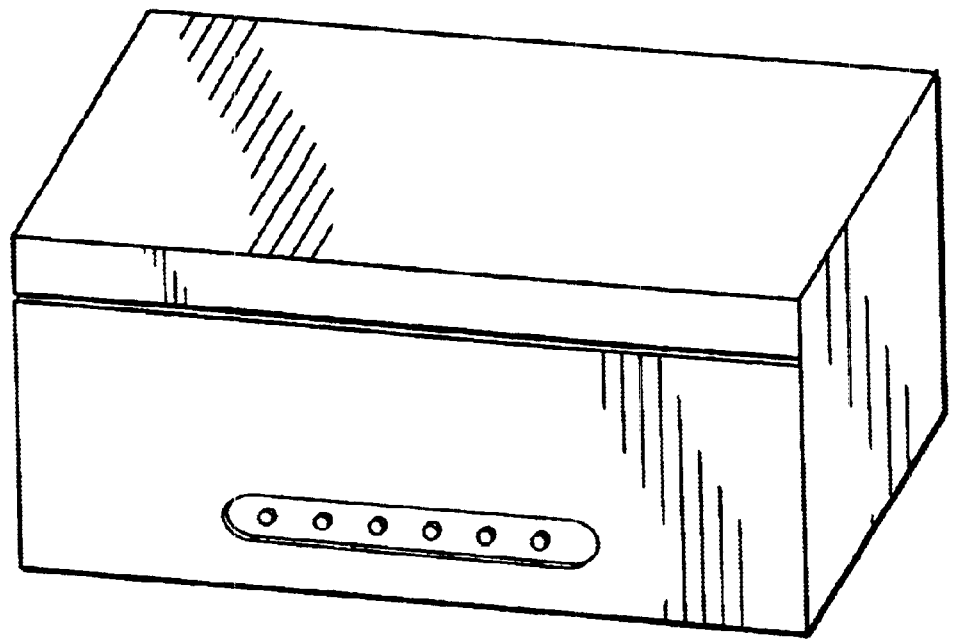
FIGS. 8–9 are isometric views of another embodiment of a high power systems integration amplifier used in the present invention.
Figure 9:
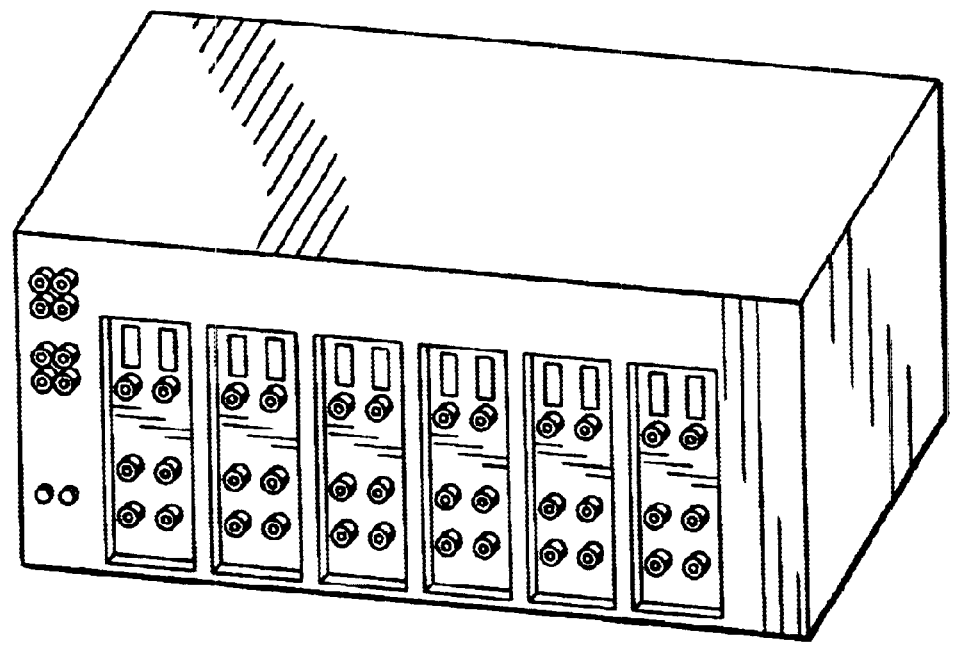
Figure 10:
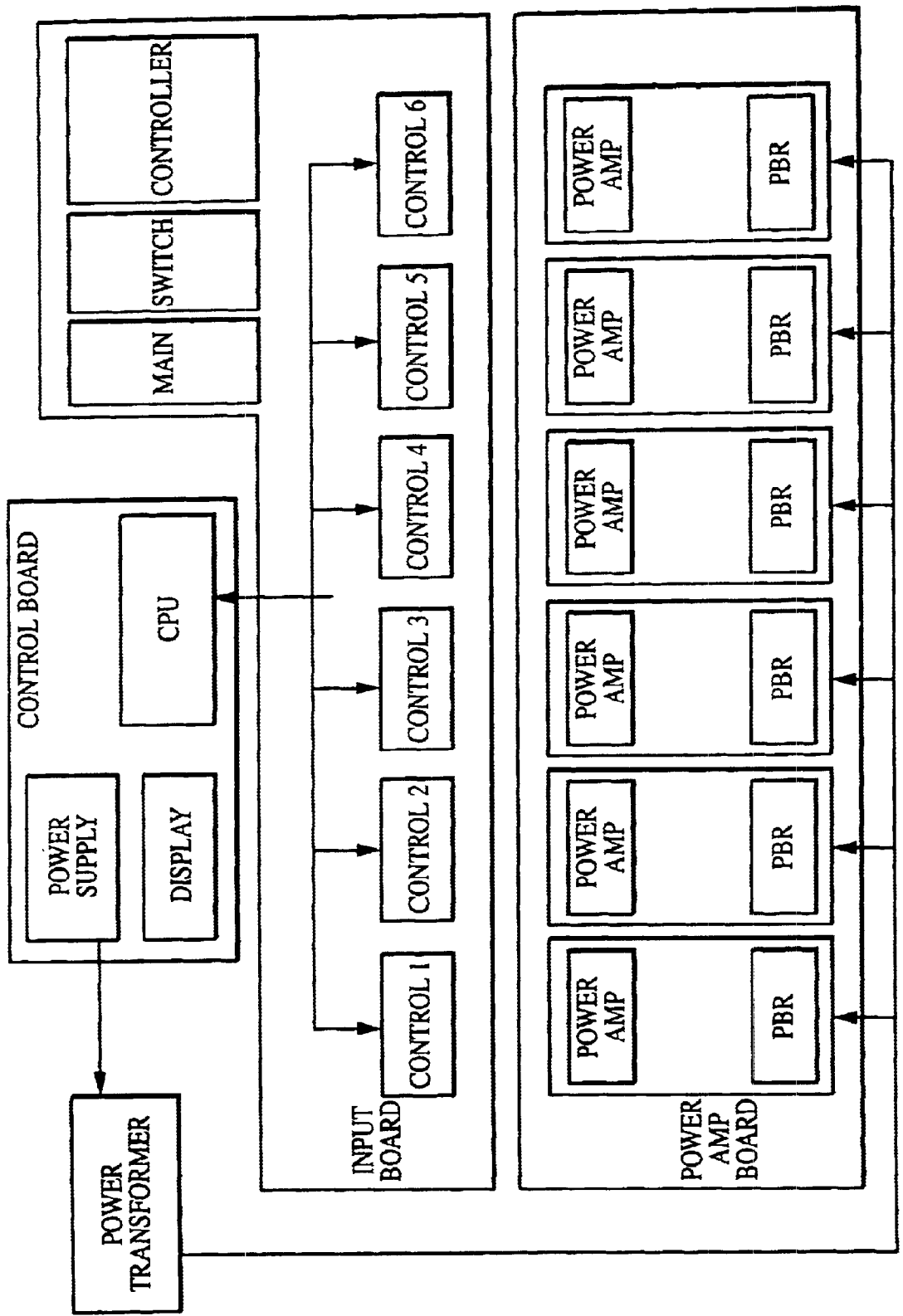
FIG. 10 is a block diagram of the power amplifier board, input board, control board and power transformer of the present invention.
Figure 11A:
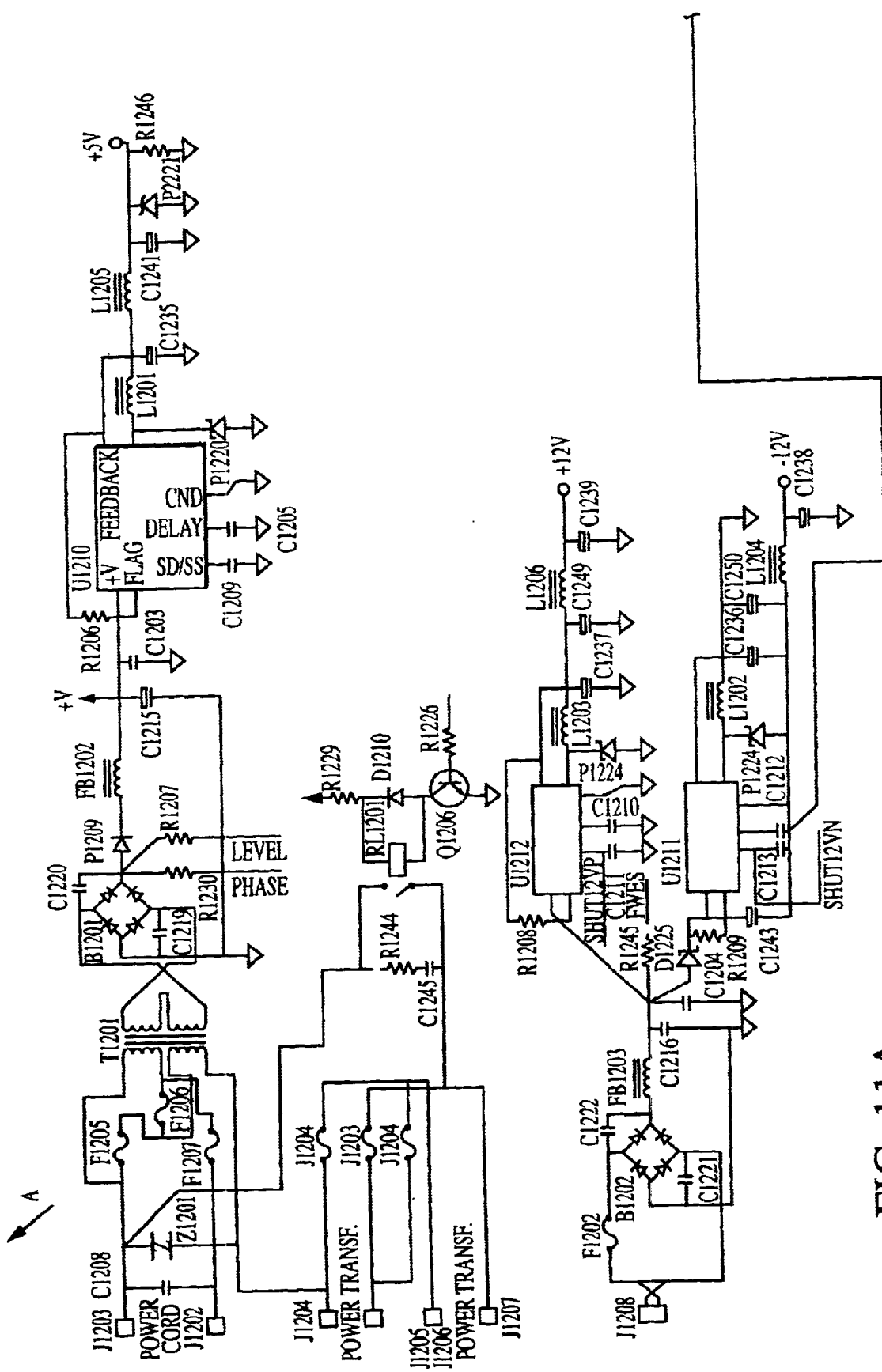
FIGS. 11–20 are schematic diagrams for the amplifier used in the present invention.
Figure 11B:
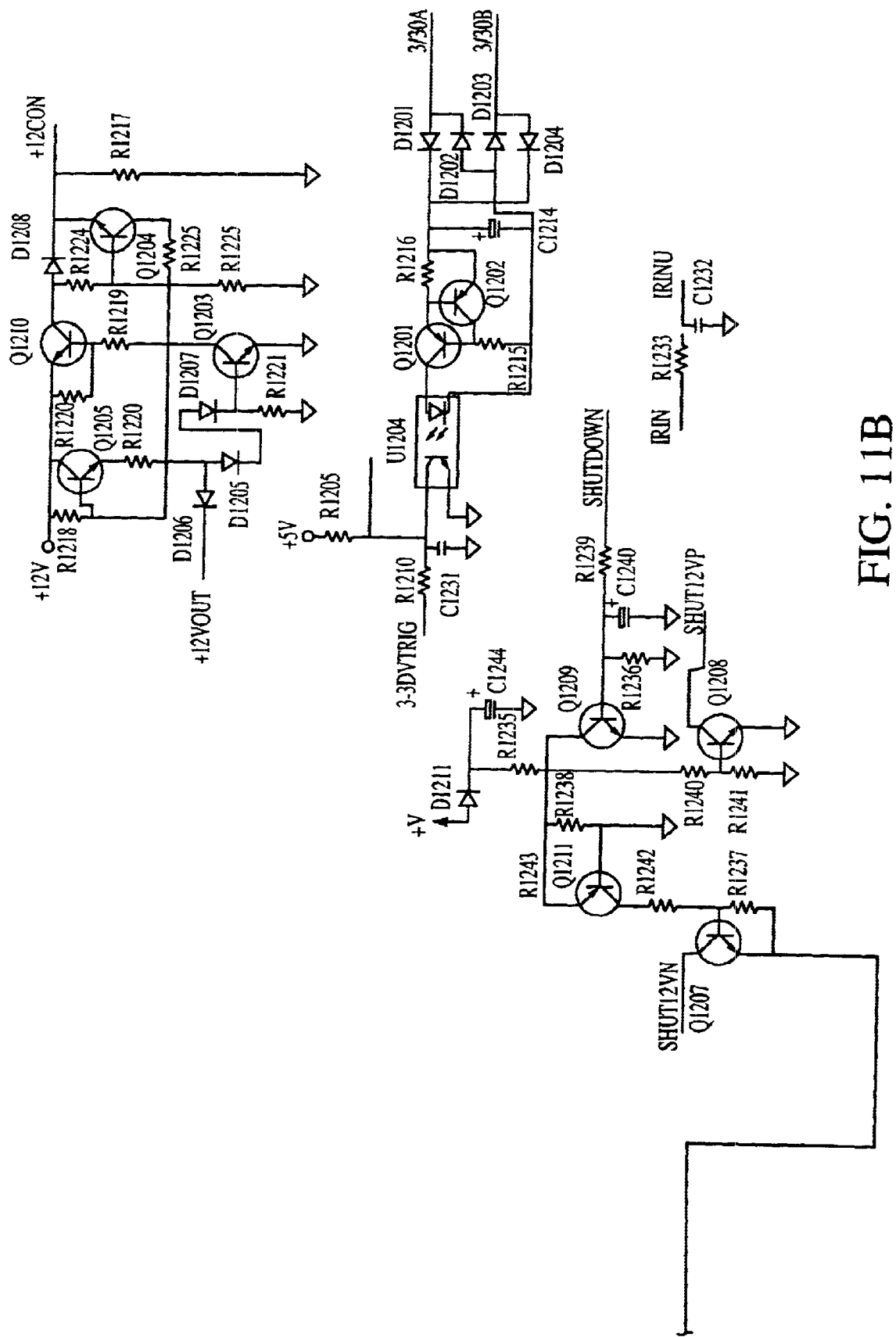
Figure 11C:
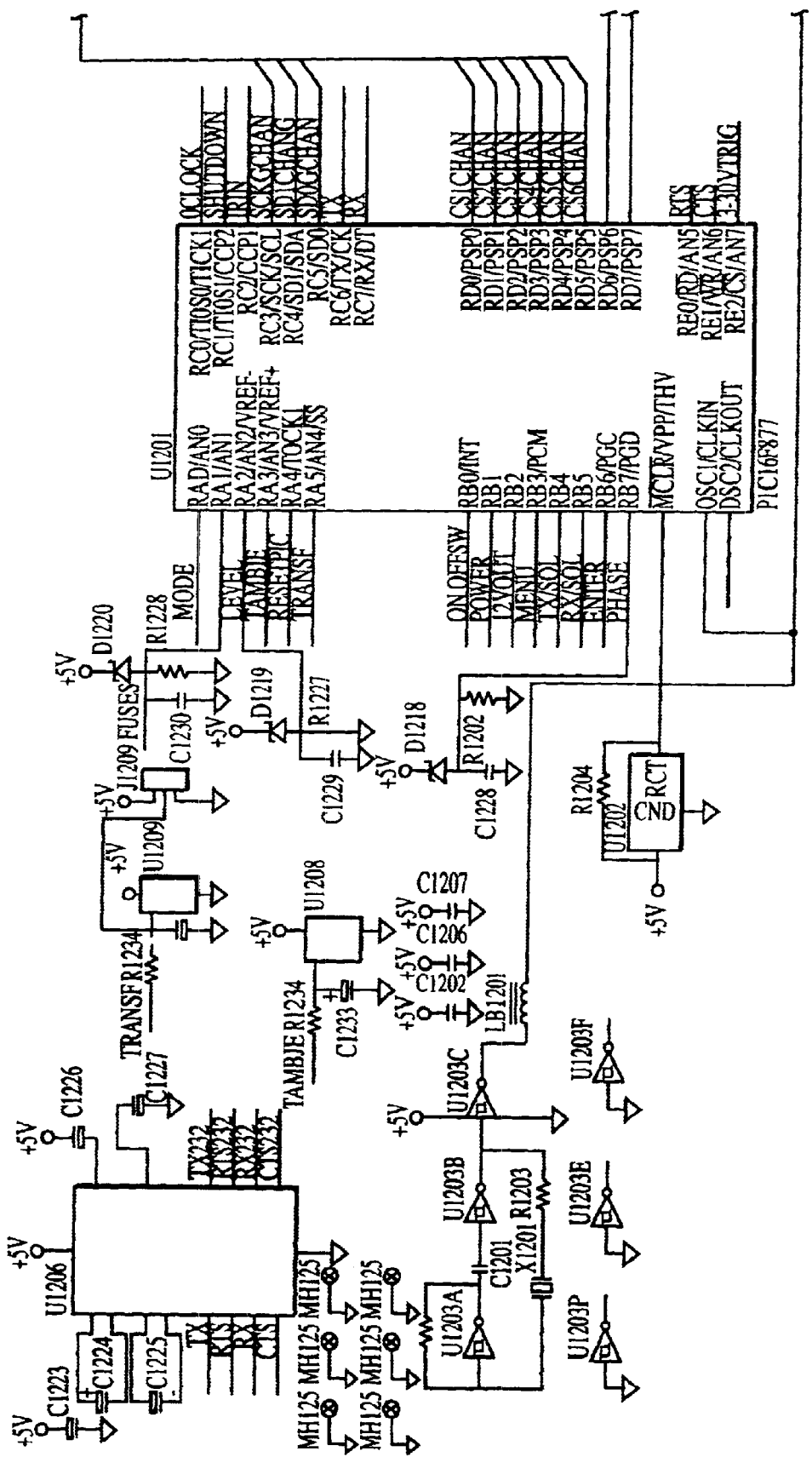
Figure 11D:
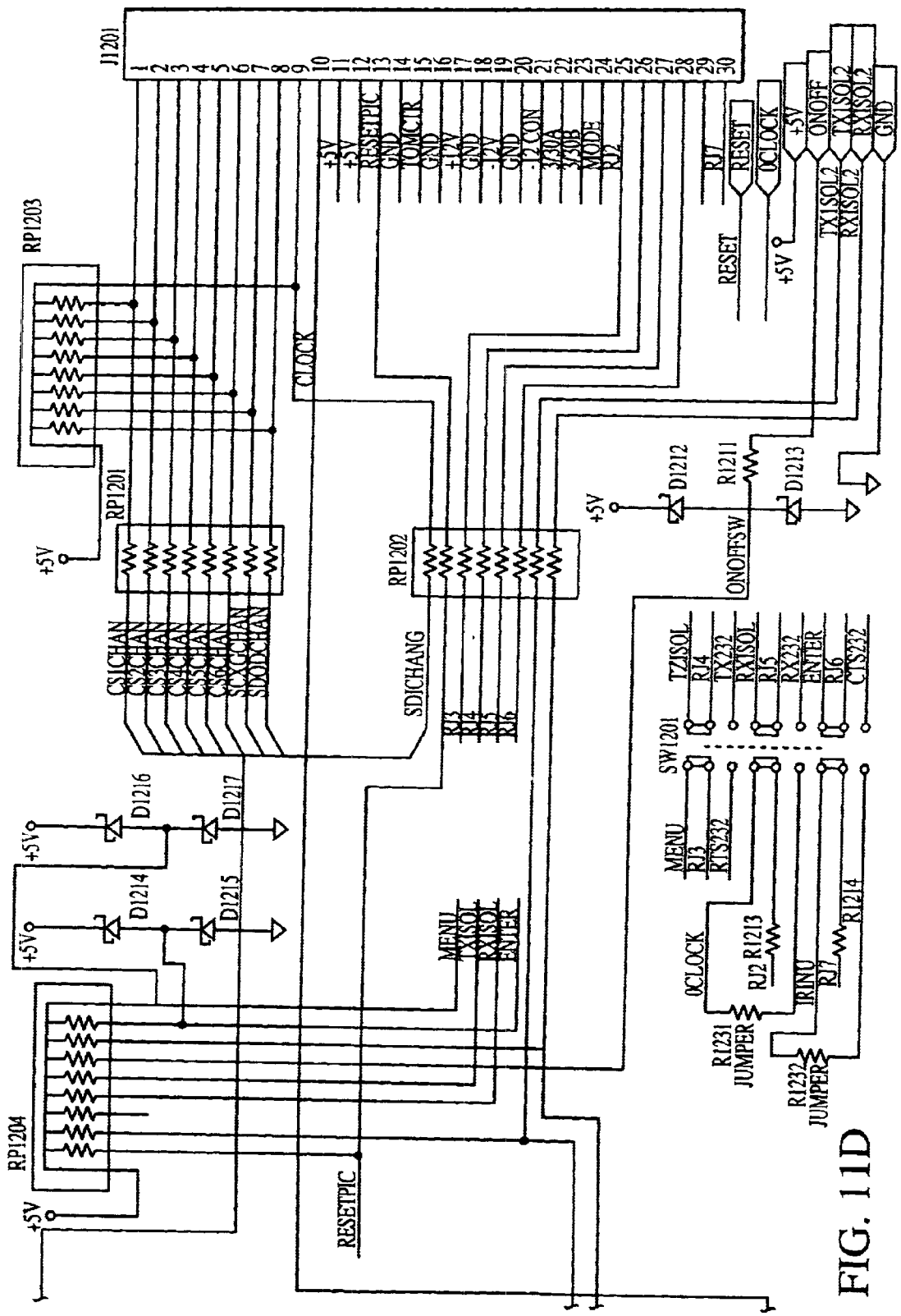
Figure 12:
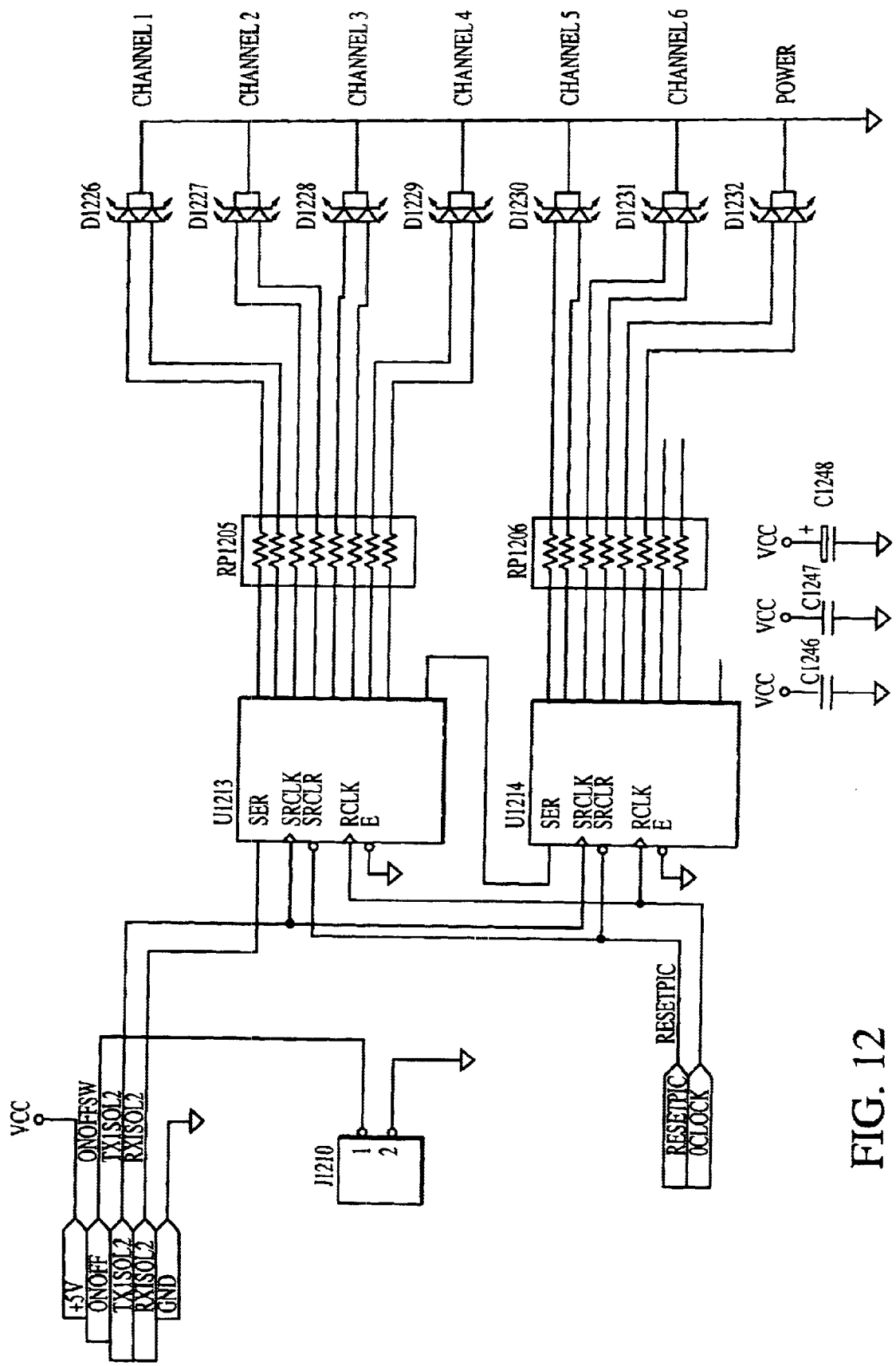
Figure 13A:
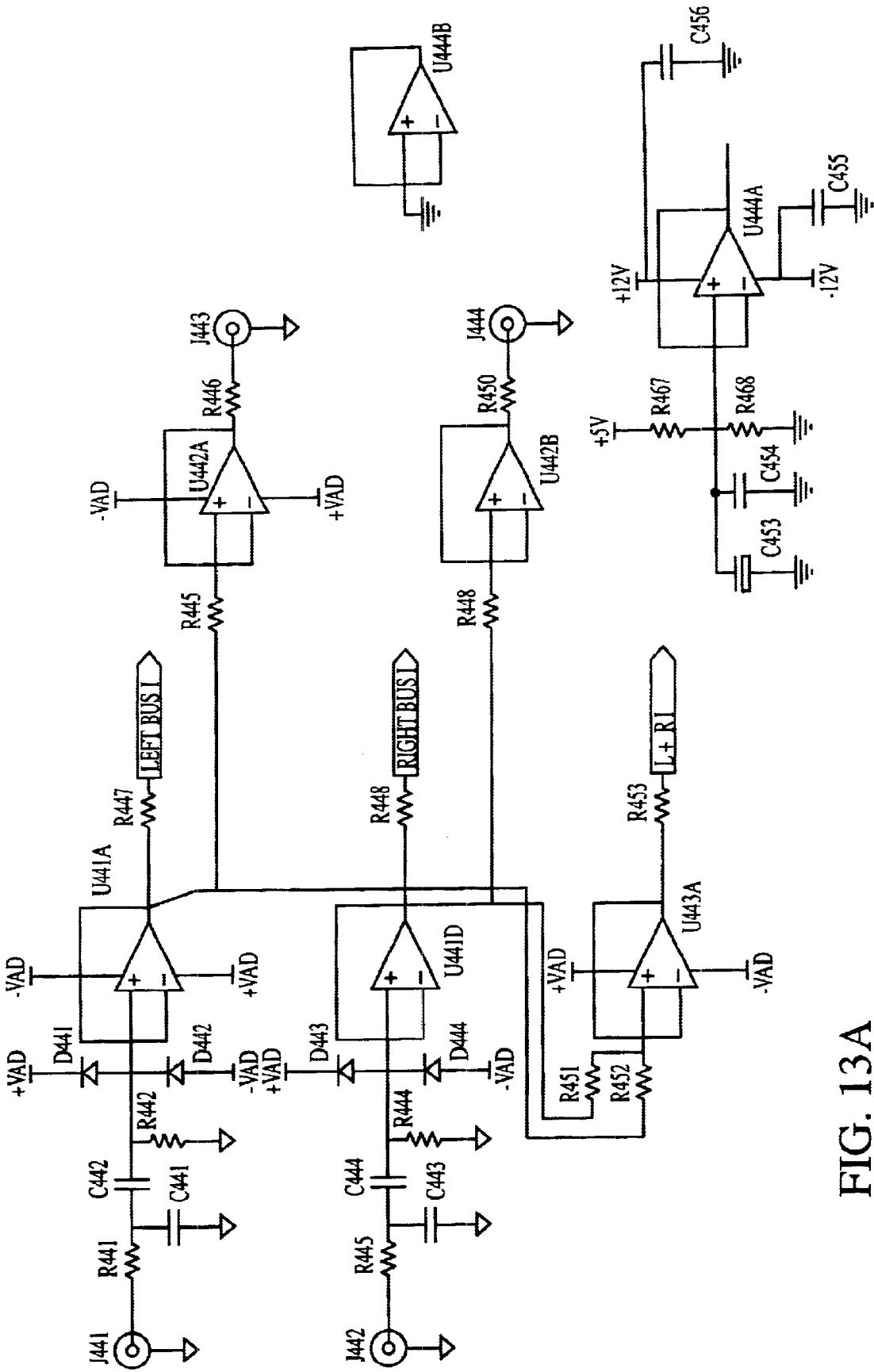
Figure 13B:
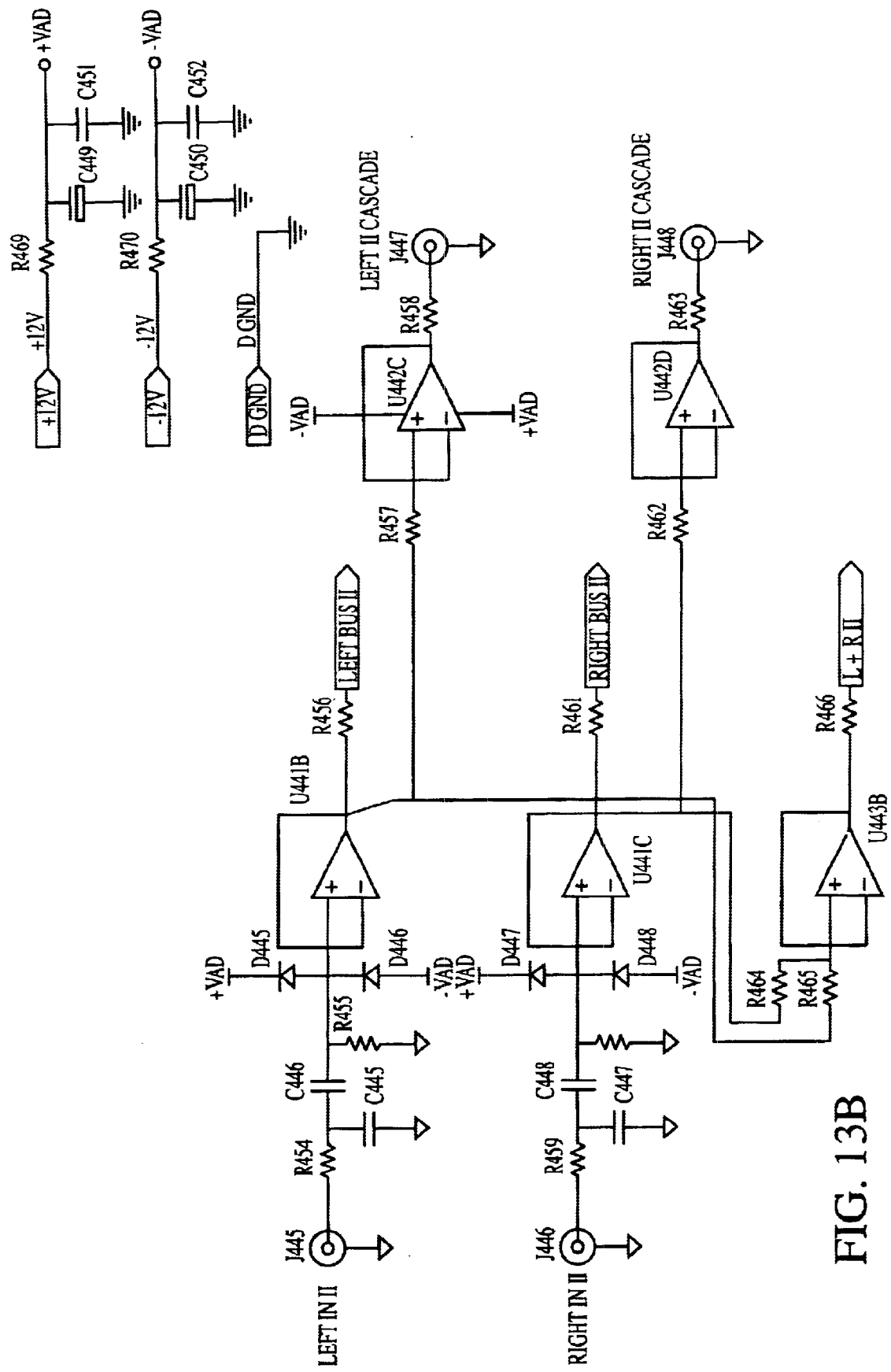
Figure 14A:
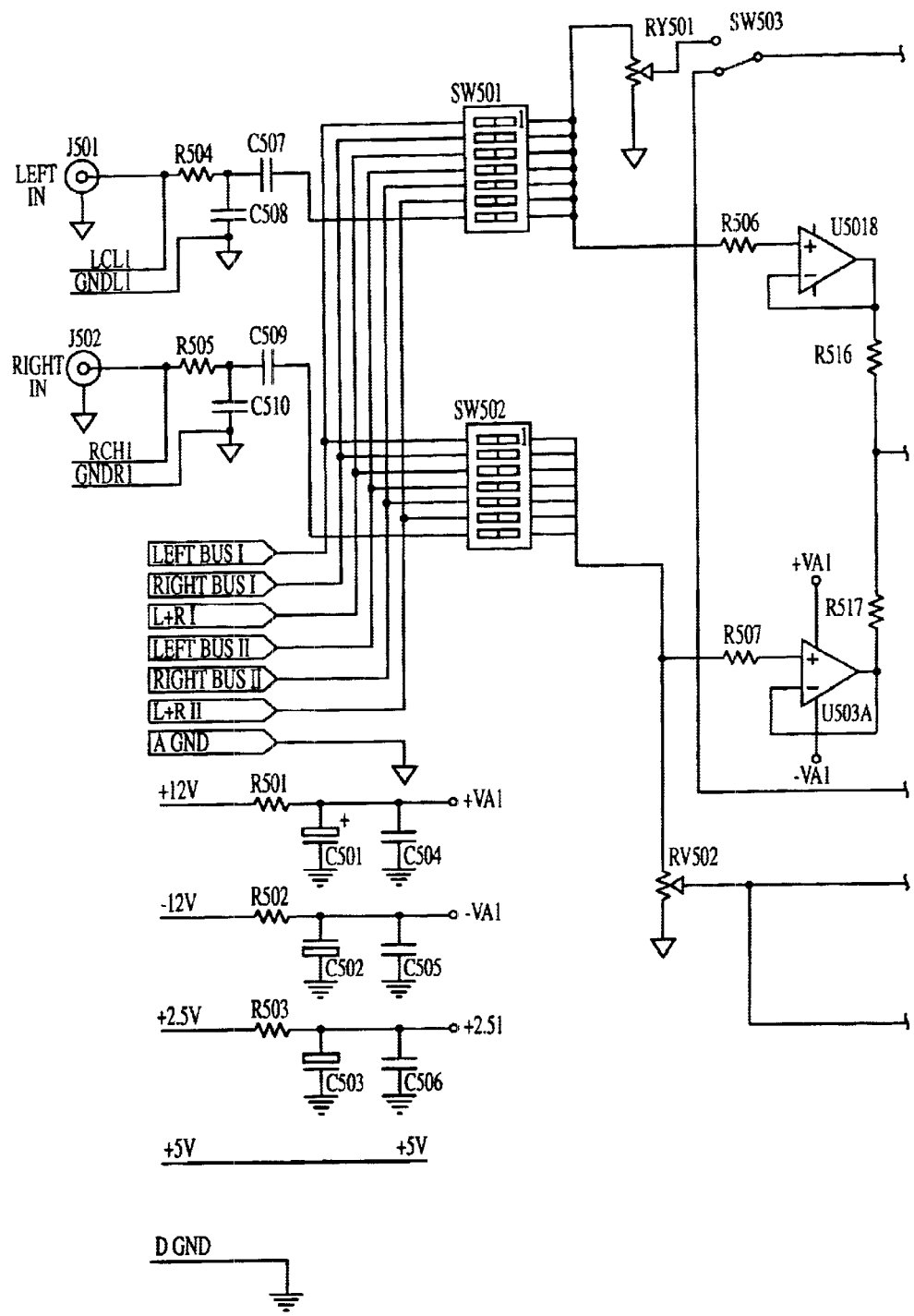
Figure 14B:
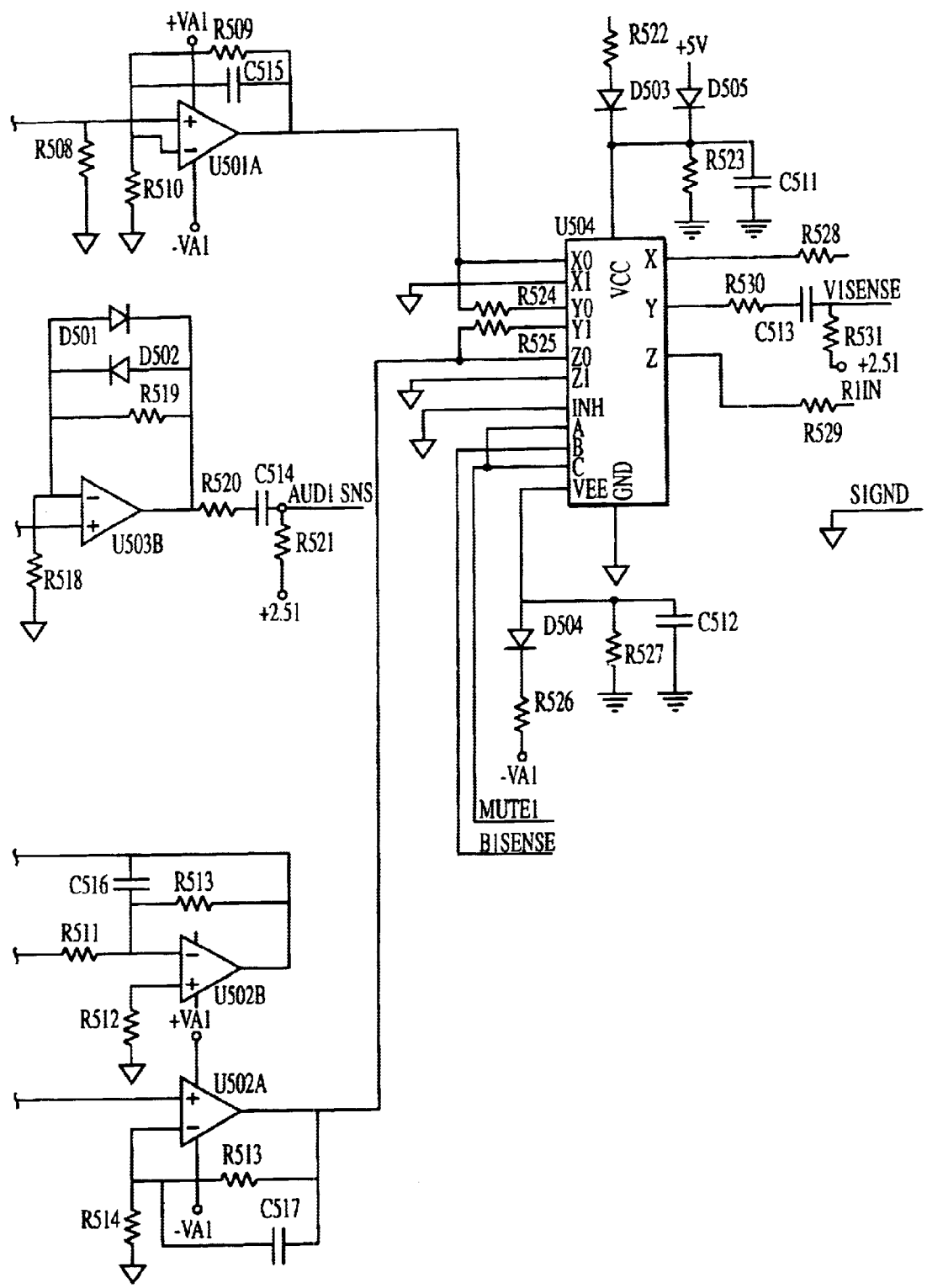
Figure 15:
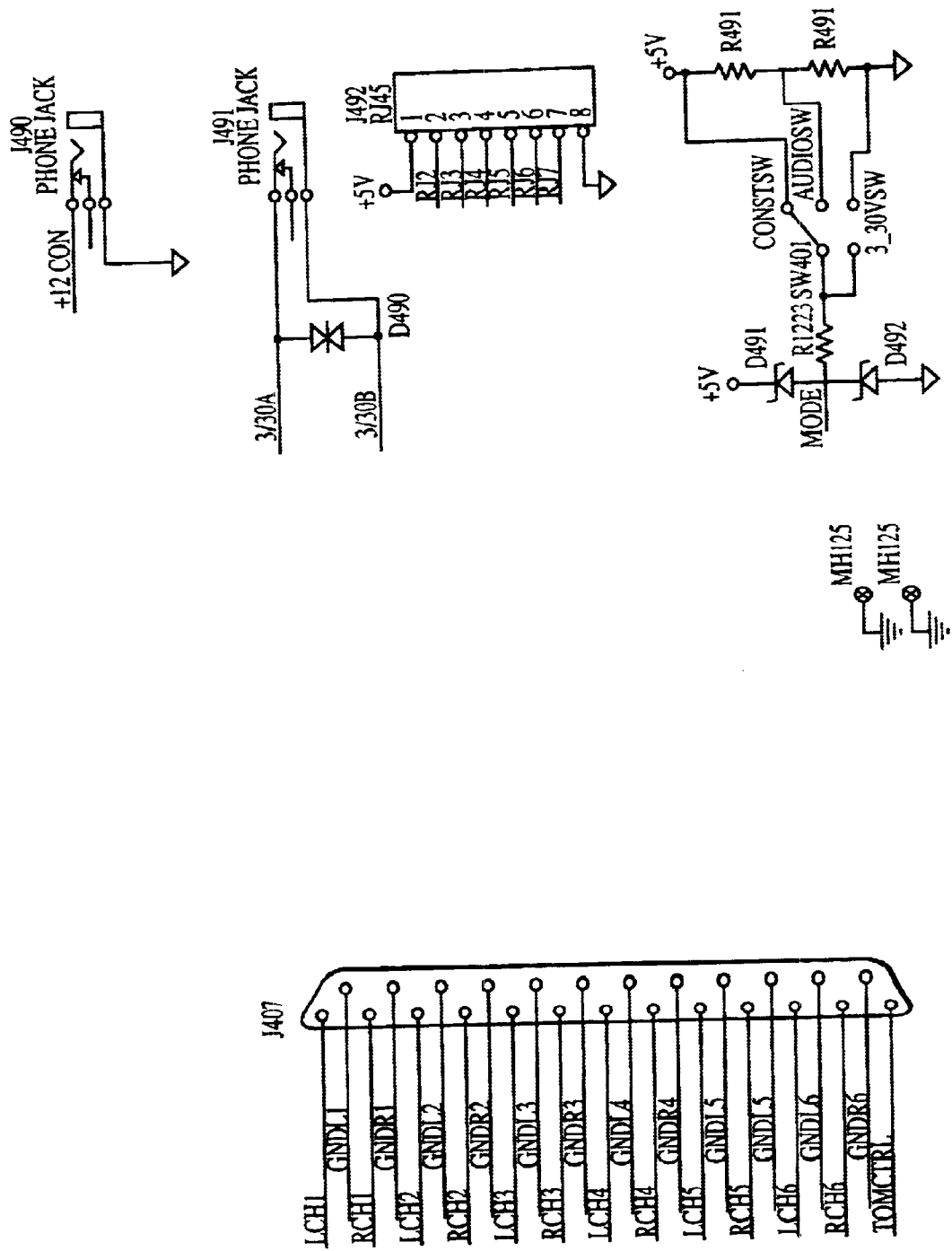
Figure 16:
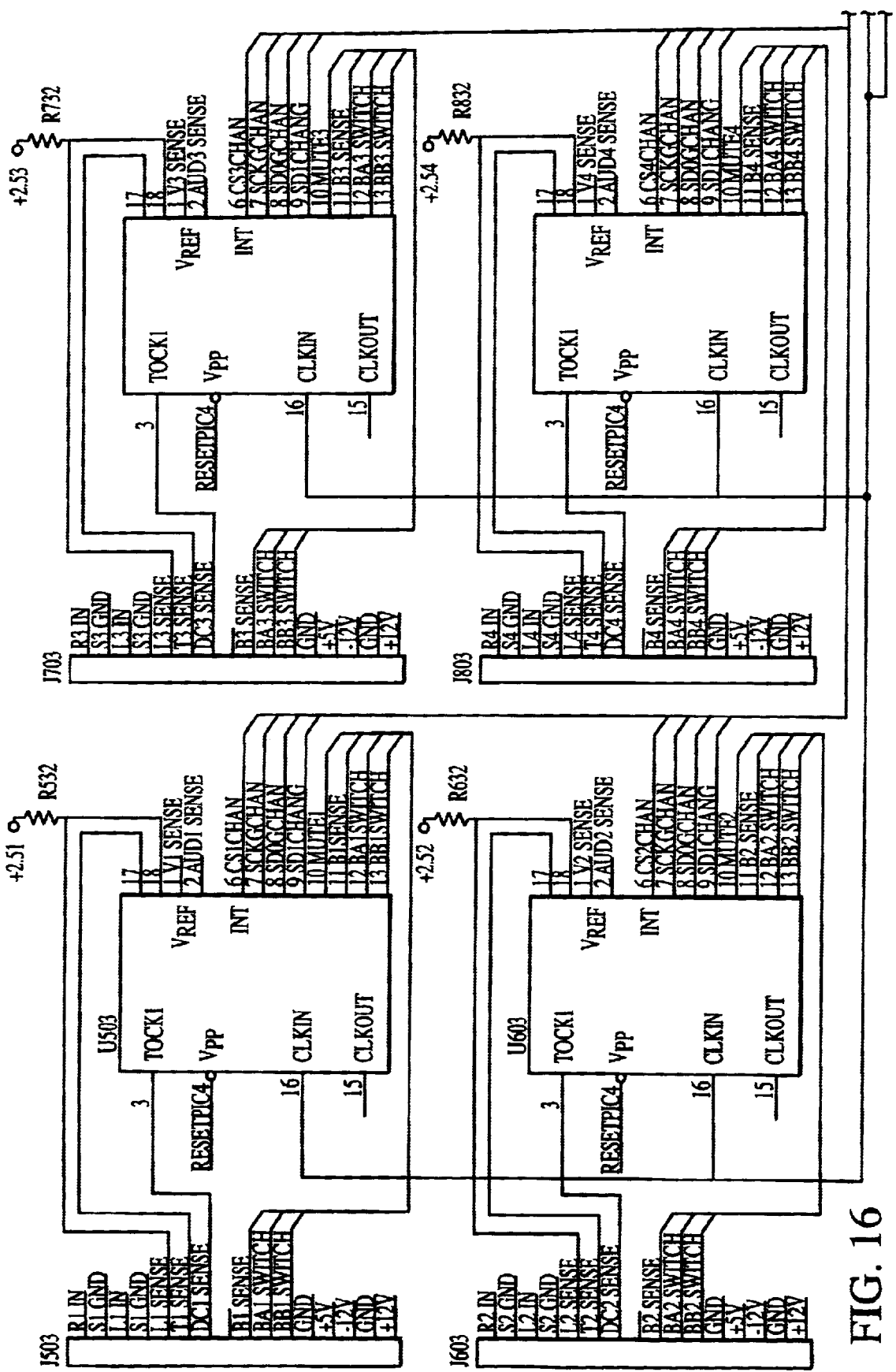
Figure 17:
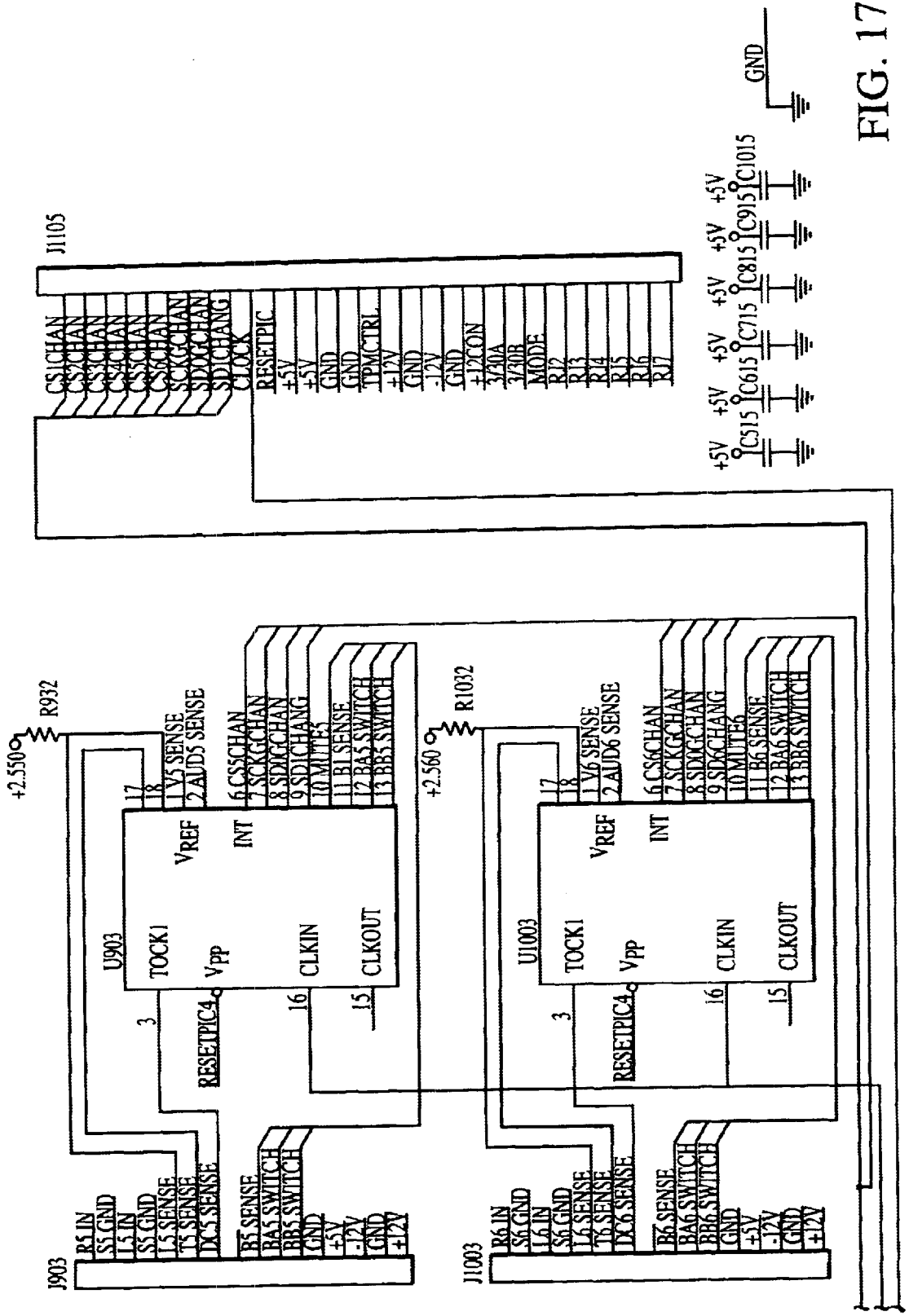
Figure 18A:
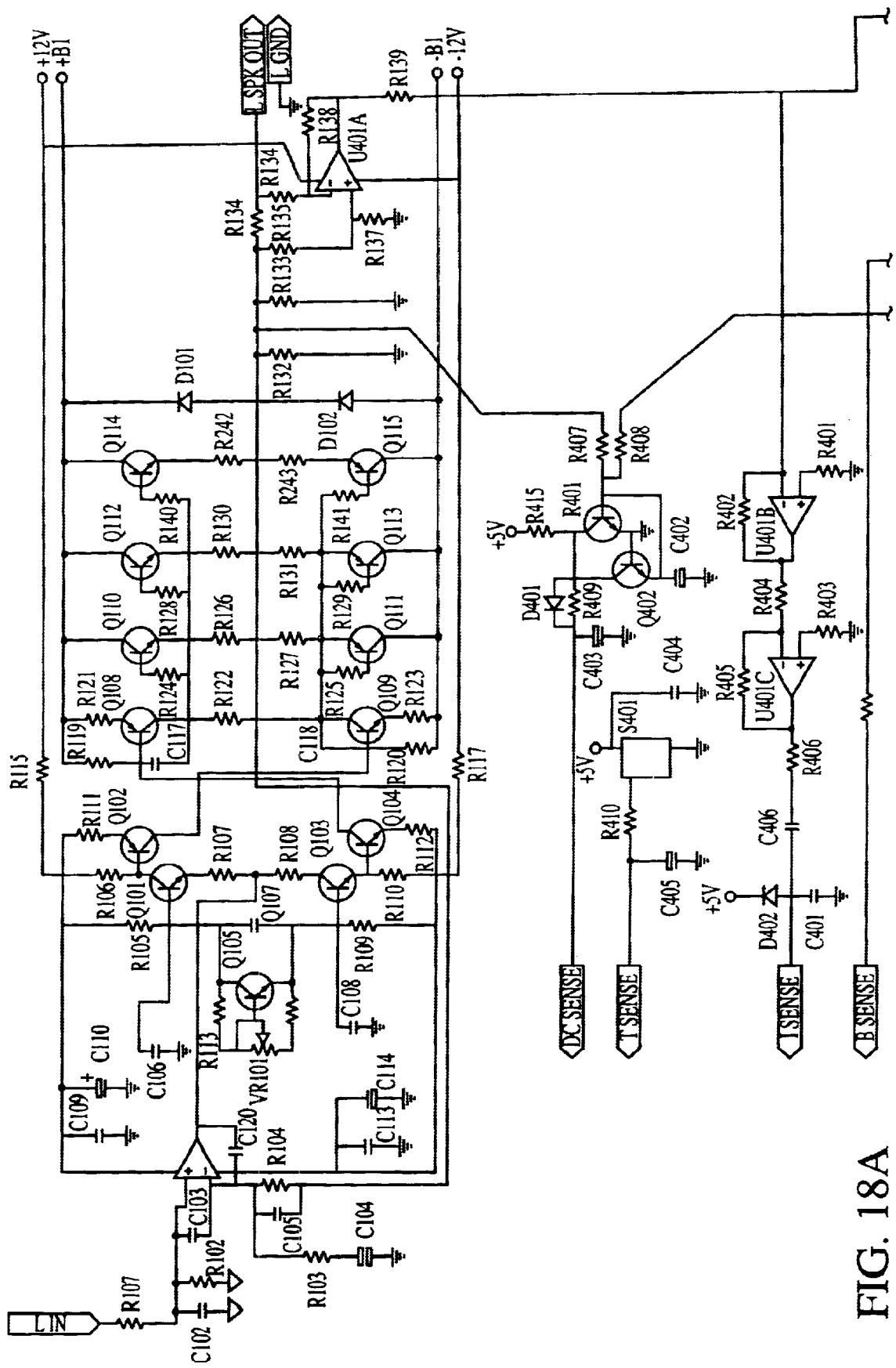
Figure 18B:
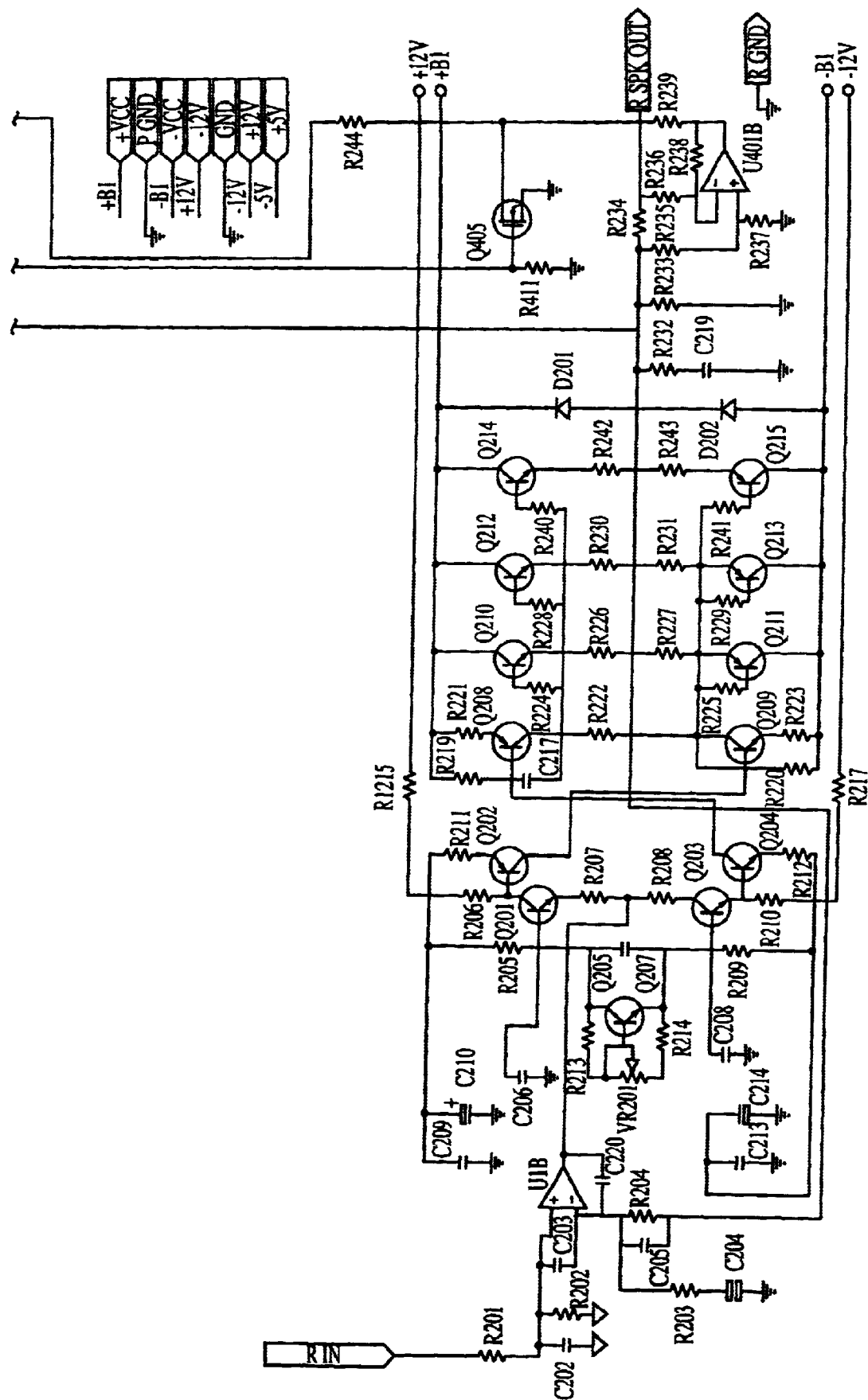
Figure 19:
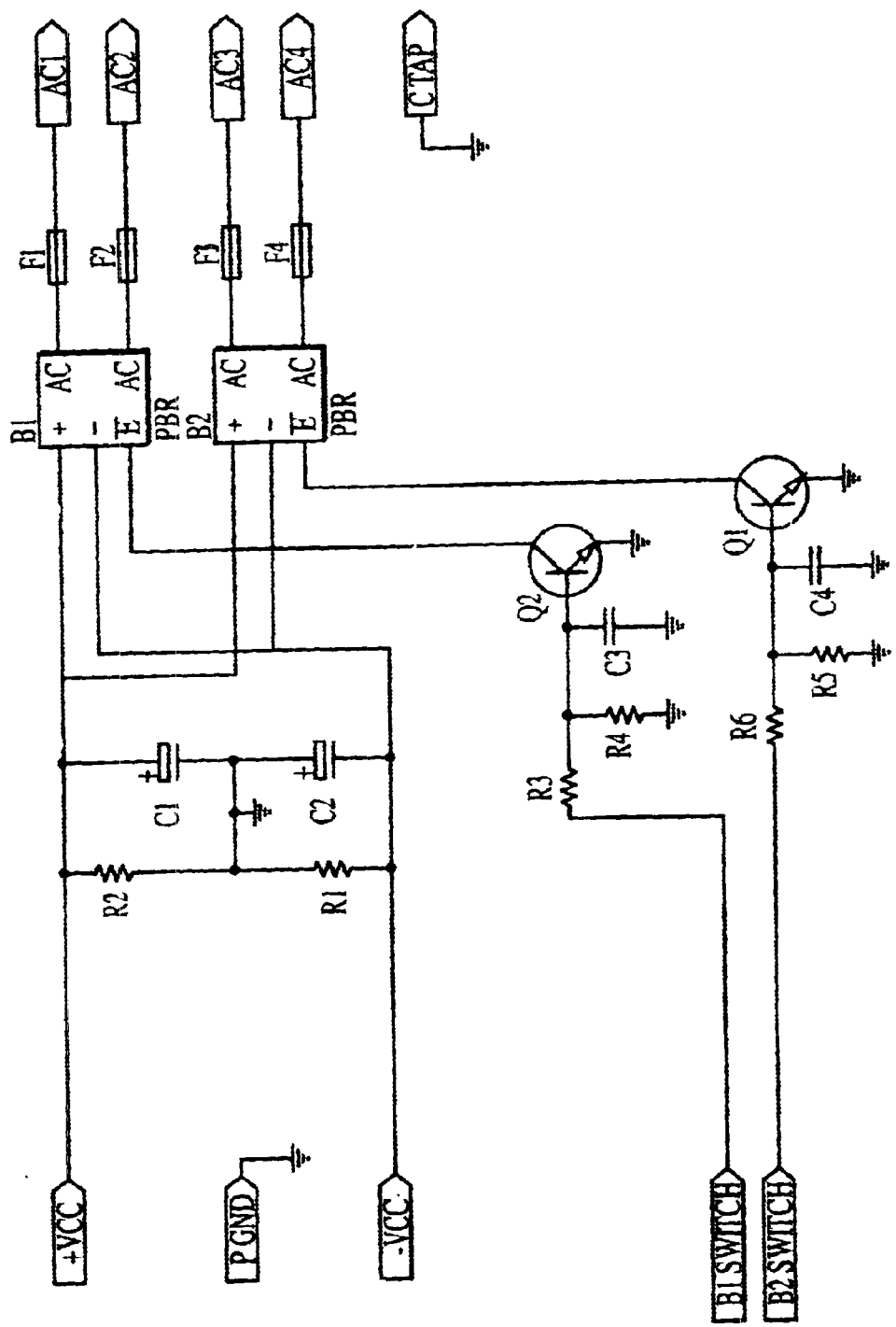
Figure 20:
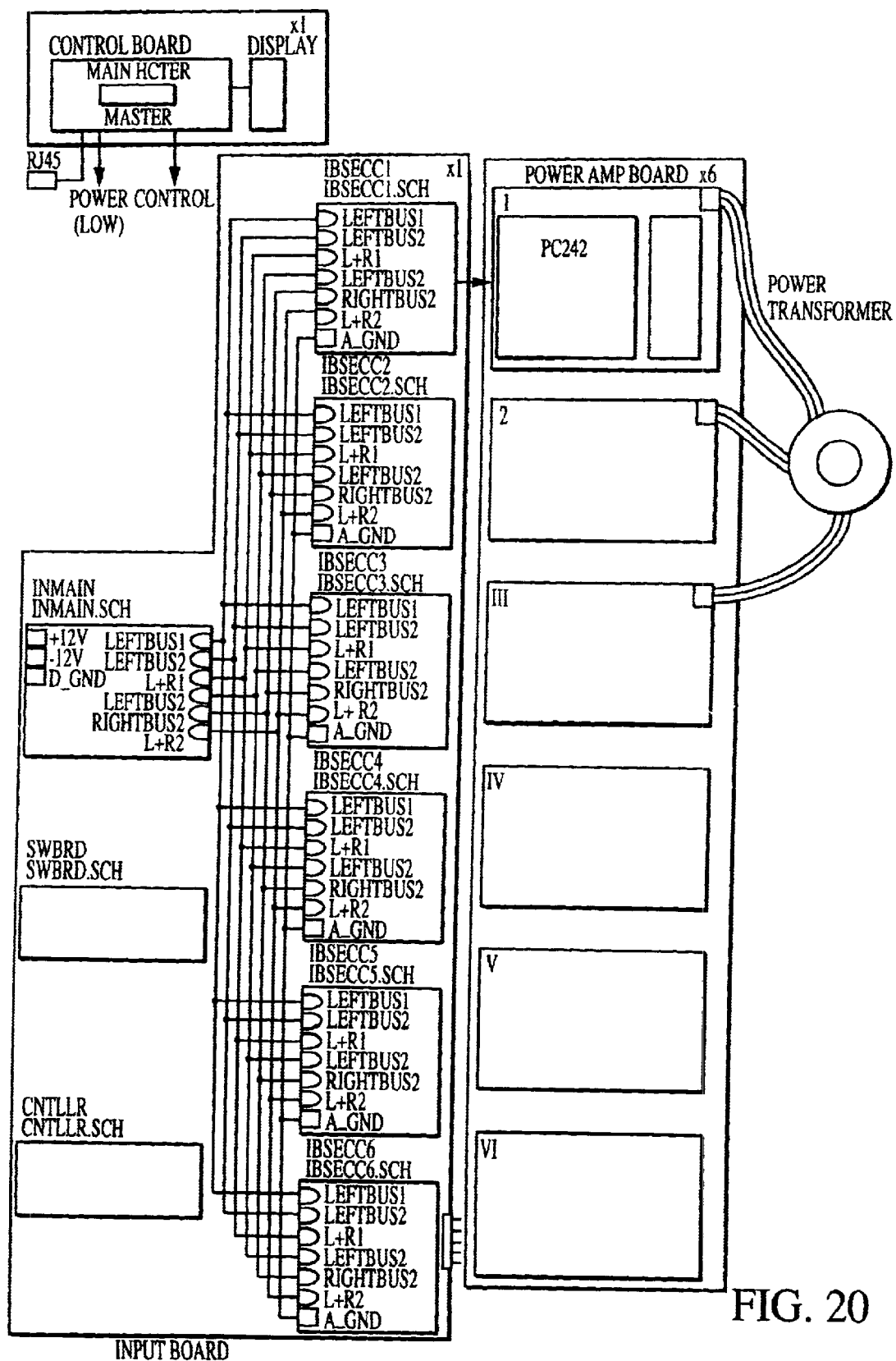
Figure 21:
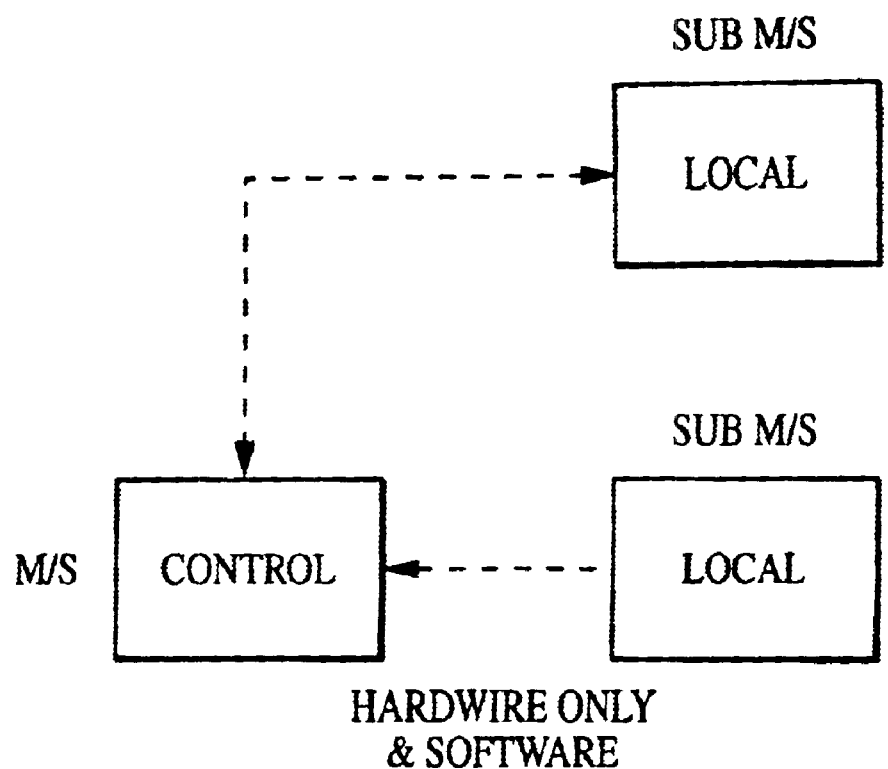
FIG. 21 is a block diagram of the expandable master-slave configuration working with a central and local master slave device.
Figure 22:
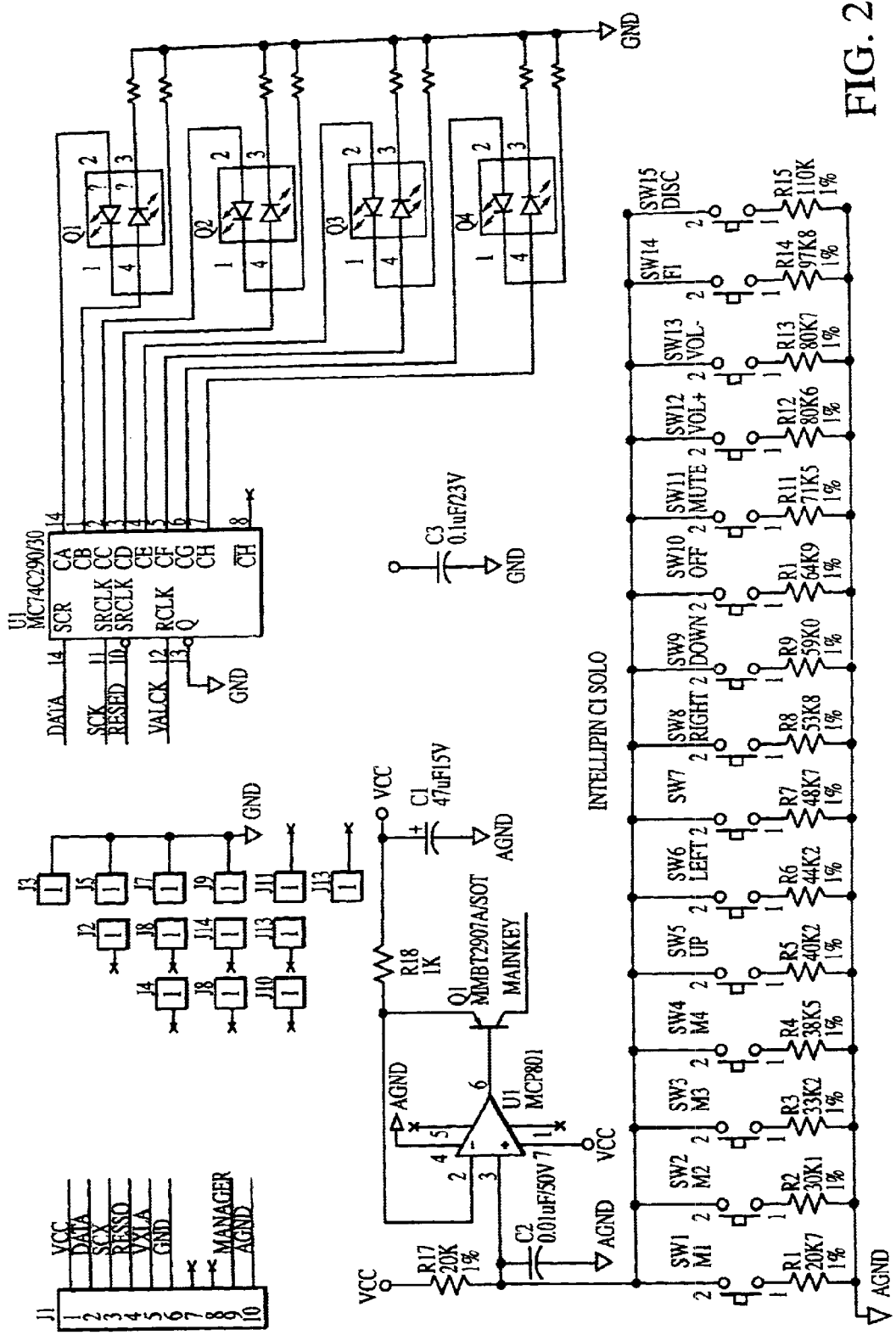
FIGS. 22–25 are schematic drawings of central intelligence amplifiers.
Figure 23:
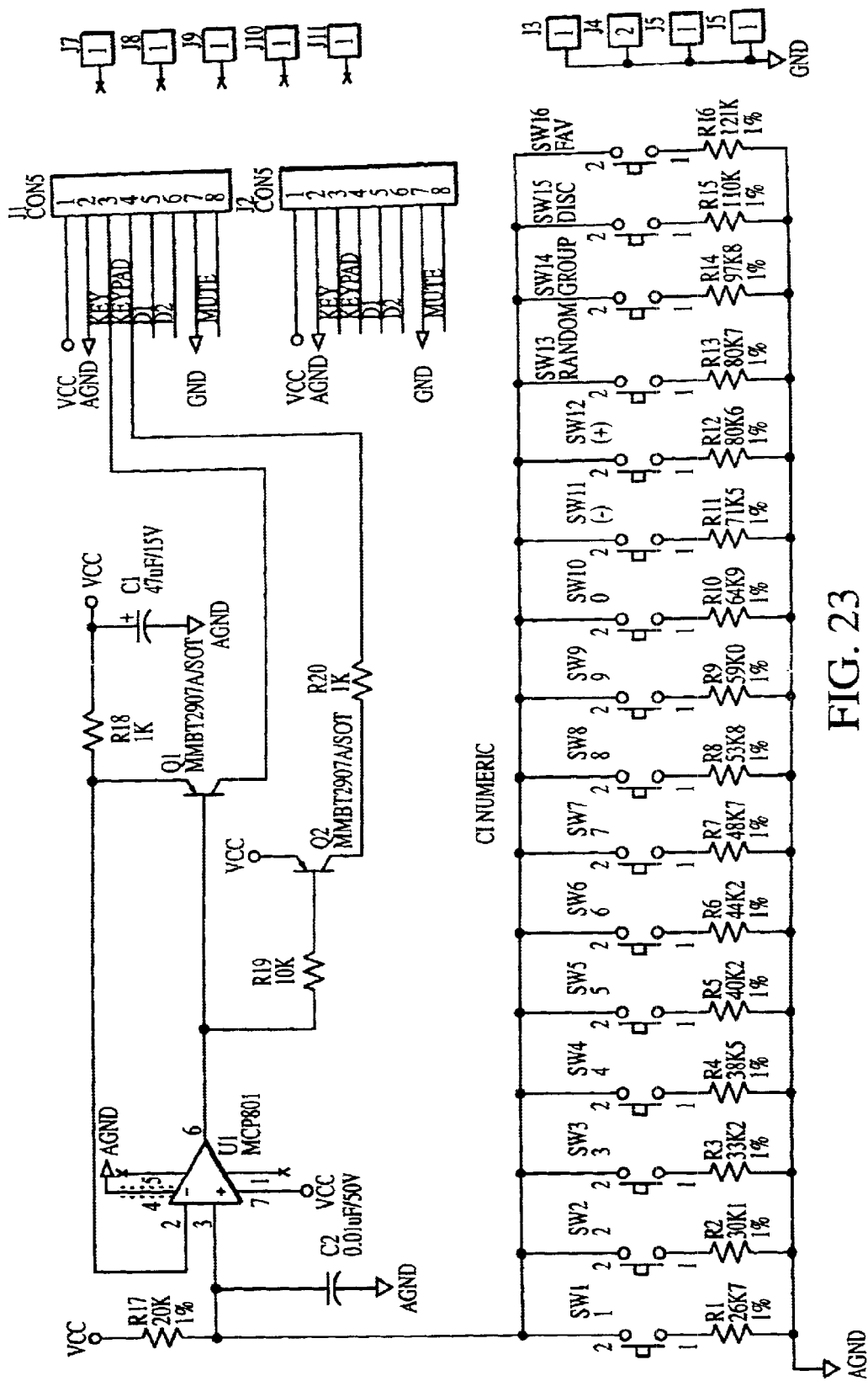
Figure 24A:
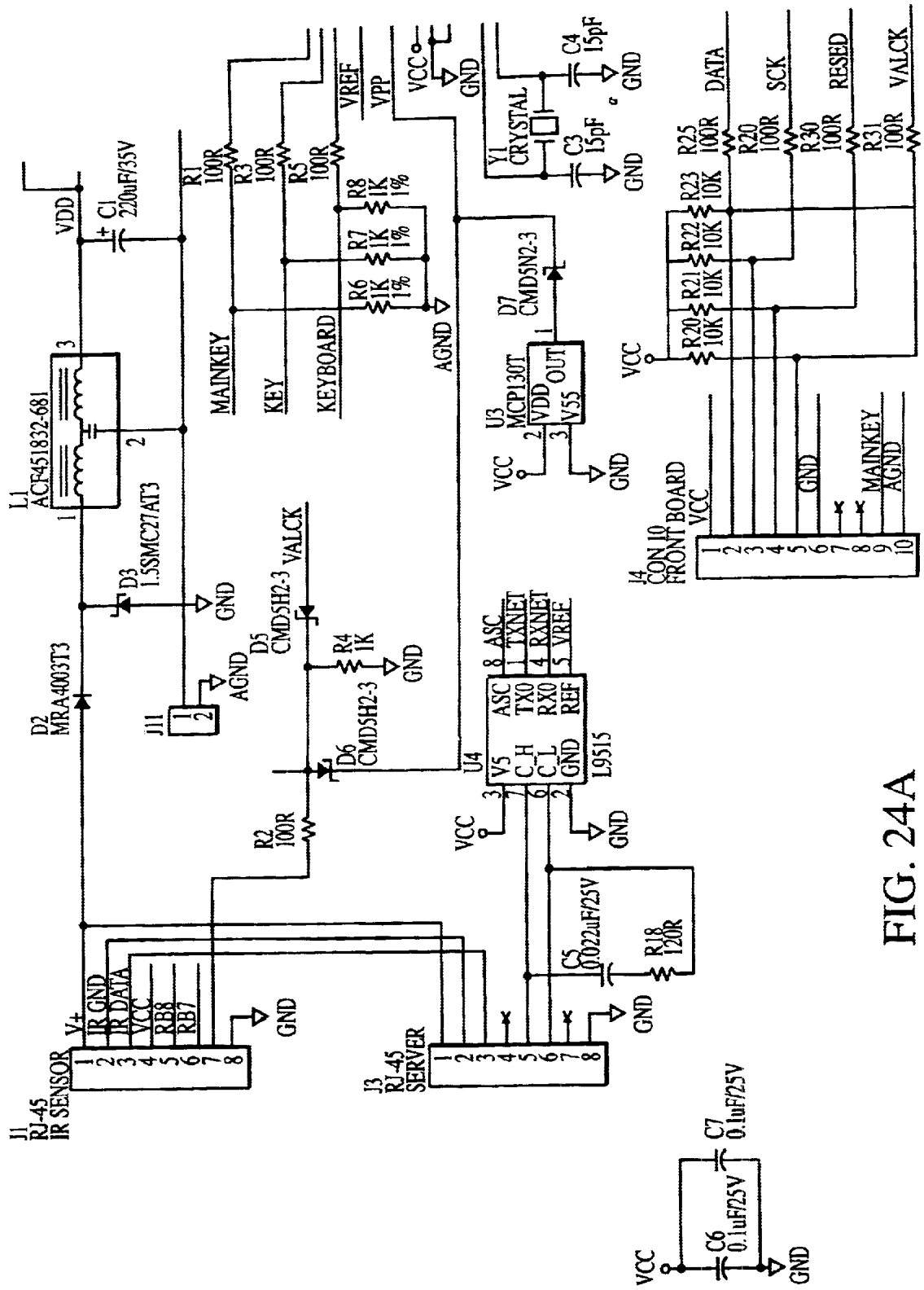
Figure 24B:
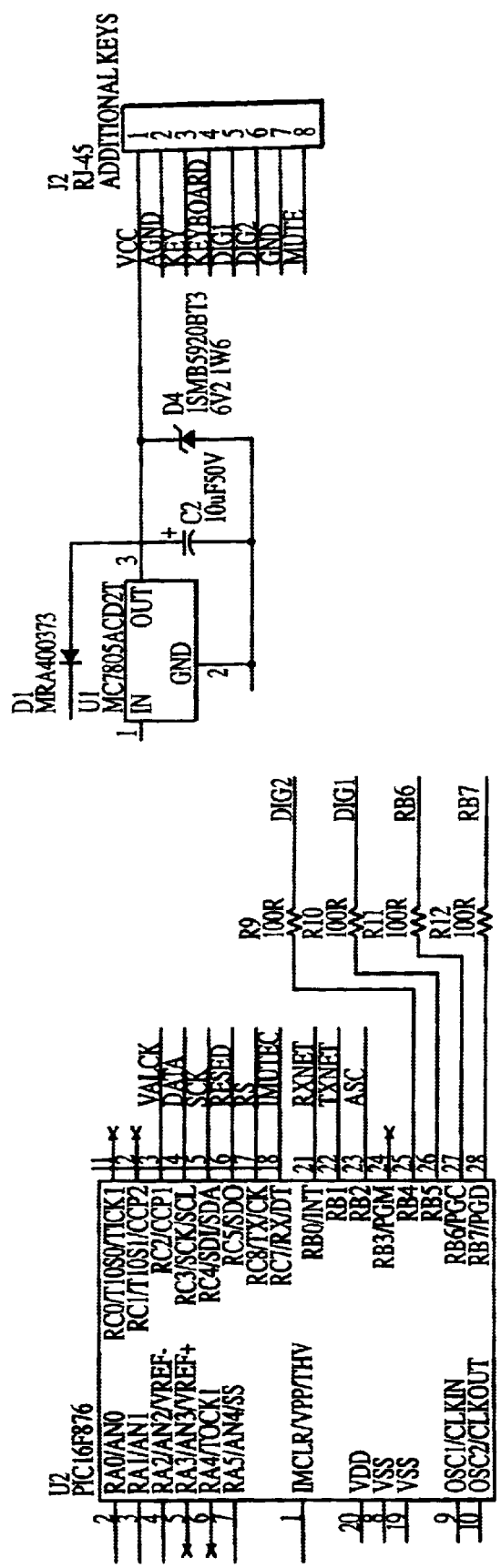
Figure 24B:
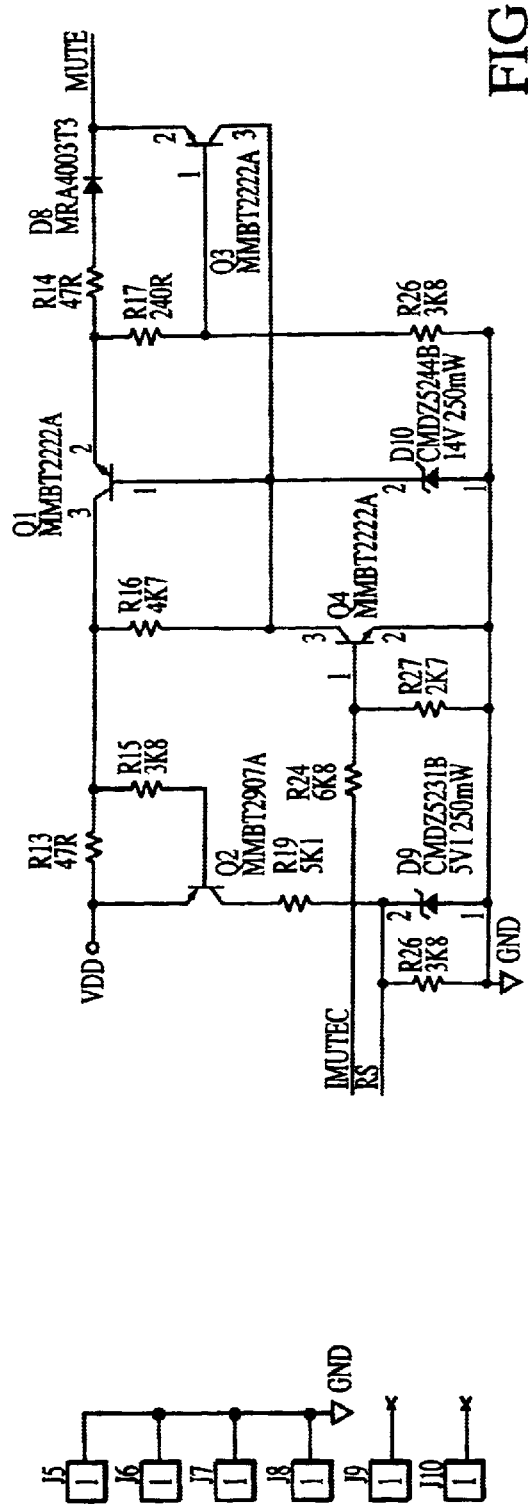

Referring now to FIGS. 8–20, there are illustrated drawings showing a high power, twelve-channel systems integration amplifier. As shown in FIGS. 8 and 9, the amplifier includes a seven-inch tall chassis that houses advanced power circuitry. It is a microprocessor-based dual stage power supply that compliments a discrete output transistor topology and maximizes efficiency, reduces heat and optimizes performance. Heat sinks are used with no fans and the circuits, as illustrated in FIGS. 10–20, eliminate thumps during turn-on and contribute to stealth operation. The circuits shown in the drawings show a dynamic protection circuitry and provide an intuitive user/installer feedback display for system operation and trouble-shooting. These schematic circuit drawings also show the use of the multi-channel controllers and amplifiers for audio/video architecture. Other schematic circuit drawings show a central intelligence system to achieve audio and video throughout the home. FIG. 21 shows the use of central and local master slave systems for the network, while FIG. 22 show a central intelligent pad circuitry, and FIG. 23 shows a circuit for DSS, CD/DVD changers and AM/FM tuners and allows a change of identity each time a new source is selected. The network of the central intelligence uses a robust proprietary protocol for two-way communications and monitoring. It uses analog keypads and requires fewer micros and takes advantage of analog characteristics. There are additional features for more controls with the slave to master micro.

The amplifier has networking detection capabilities and multiplexing detection capabilities with auto sensing processing and detection. The amplifier analyzes software to reduce and eliminate noise or pops that are primarily due to additional appliances. It recognizes this by looking to see if there is a one-time event, and if so, then ignores, and if not, it turns on.

Figure 26:
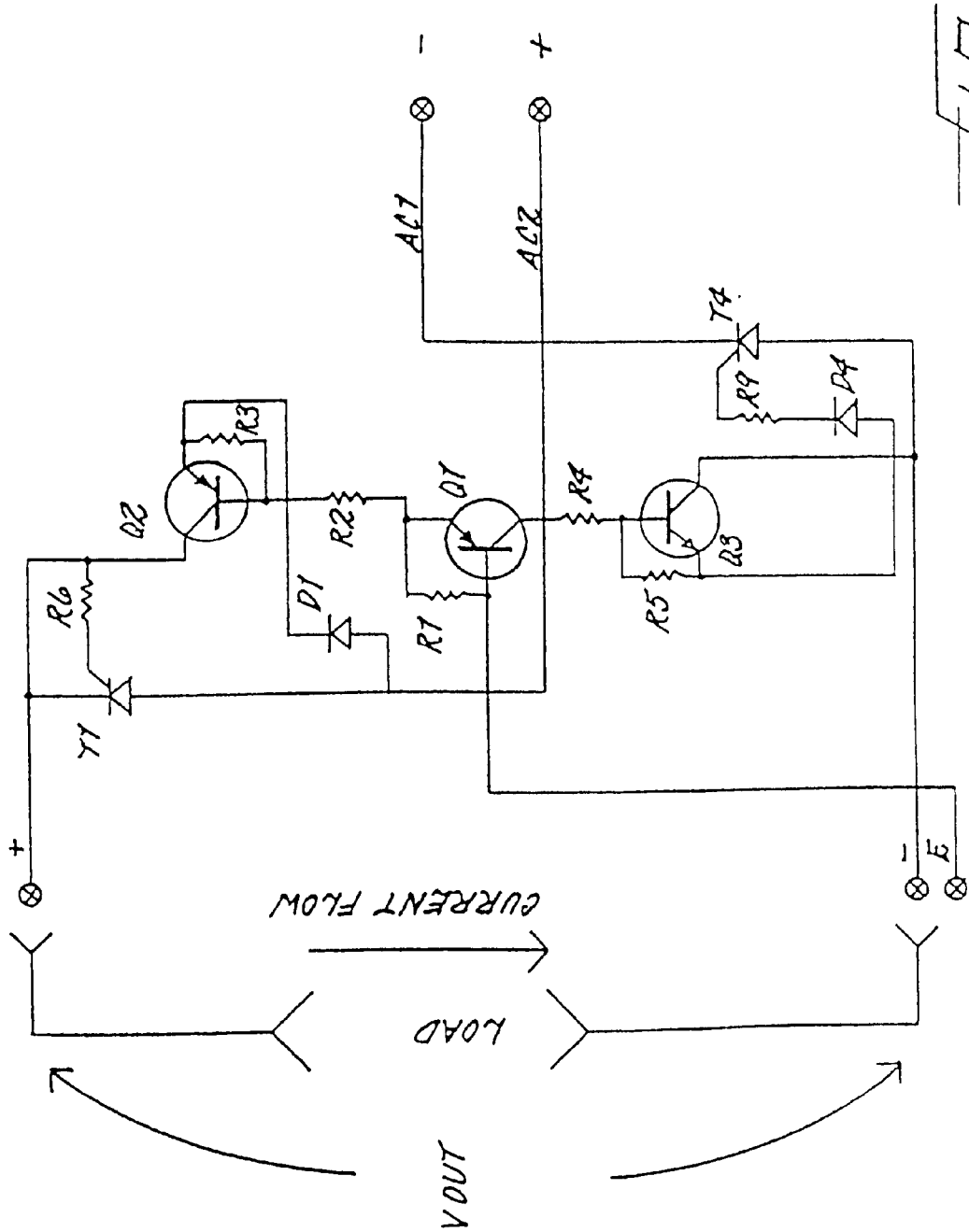
FIG. 26 is a schematic diagram of a programmable bride rectifier of the invention.

The programmable bridge rectifier shown in FIG. 26 allows the control of power on and power off. It has a circuit board that could be an ASIC. It could use a soft start and a bridge with an extra pin. It has high rails and low rails to detect, which is required by the input voltage. It has a complete thermal analysis to track temperatures of six different heat sinks (together with the transformer and unit itself for underwriter laboratories) making eight temperatures. It also has reports for diagnostic ability. It is a smart terminal, allowing shut down. One controller can be used, but can continue with the others, and acts as a seventh microprocessor. It can signal with a colored LED. It can automatically switch to low power. With an overcurrent over left and right channels, it has overcurrent protection. It measures voltage when current is measured to determine impedance and uses impedance to control overcurrent protection.

As to the internal network reporting, it has temperature protection, current protection, such as DC protection on the speaker. This prevents catastrophic failures for loads, e.g., the speakers, by cutting power to speakers. It also checks impedance. If low, it can make low voltage, otherwise changes power.

It has a dual bus where each channel set has its own inputs and allows plugging into the first set and plugging into the second set and allows configuration without extra wiring. The bridging amplifier is over both channels and checks to see if it is in bridge mode with bridge overcurrent protection.

There are three different modes with triggers. In a constant mode of the power switch, it can talk back to the channel. Typically when it is off, it waits for three minutes to make sure. In the twelve volt trigger mode (DCM), it turns on like constant mode for an active state. In an auto-sense mode, the system informs which real channels are on by the LED and which others are off.

In an overvoltage/undervoltage mode, it uses an A/D converter and standby transformer to guarantee that amplifiers work. It is off by itself and on by itself.

It can monitor and detect if the network is inoperable. It can shut down all circuits. If there is a catastrophic failure of one micro, then all shut down because the protection is not needed. It has an override with a password to check for maintenance. It also has fuse protection for 220 volts or 120 volts with manual selection of position for other countries and a standby.

This home automation network has an expandable master-slave configuration and robust two-way communication protocol and associated methods. It is expandable and the keypads allow longer runs with greater assurance of reliable signal with minimum parts and with analog and digital combination approach as shown in the figures. The master and slave concept is for the central intelligence network. It is possible to have a master-to-master and a master to its own slave and a not master to other slaves. This allows zones with a central system.

The network tracks all power conditions of products to prevent commands that will be determined through the system. It is an intelligent way to use the common resources. If it is master-to-master or master-submaster, then it is hardwired. If there are submaster to slave components, then it could be infrared, radio frequency or hardwire.

Figure 25:
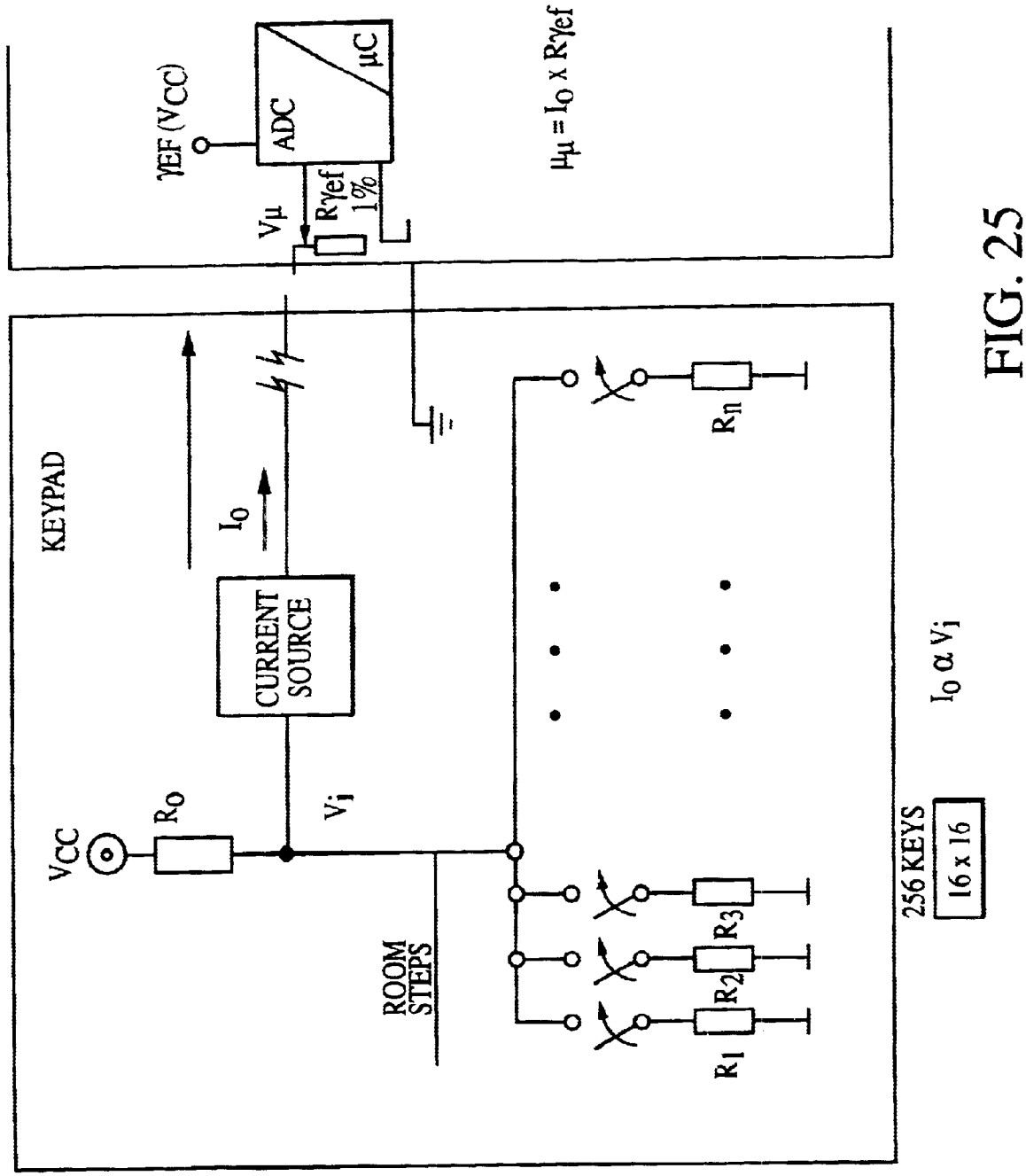

The analog keypad with its circuit shown in FIG. 25 and other figures allows a key to be pressed and generate current using a resistor network with consecutive 100 millivolts between keys as a voltage gradient. There is a micro-controller and a ten-bit analog/digital channel. Each keypad acts as a fixed current supply. There are elastomer keys for the keypad.

The analog keypad has known uses of the matrix of switch and senses numerous lines for the micro-controller. It senses voltage from the deposited key. $I_0$ is proportional to $V_f$ and is not dependent on power supply. There is only one line to the micro-controller that is remote for keypad information and only requires one ground with analog-to-digital conversion. It has a ten-bit microchip. The matrix keyboards have 16 lines and protect 16 lines.

It is evident that the present invention, as shown in the drawings and described above, allows home entertainment enthusiasts around the world to enjoy audio and video throughout their home by the system's integrated electronics using the keypads, multi-zone controllers and amplifiers that are merged into a cohesive and powerful distributed audio/video architecture.

The central intelligence system has a server with two master keypads and two accessory keypads and an auto-muting volume control. The server stores all data, monitors and broadcasts the on/off state of connected A/V equipment, receives and processes instructions from the keypads, and broadcasts the appropriate infrared commands to the A/V and lighting equipment. The server is capable of unleashing an elaborate sequence of IR commands providing end users with reliable, one-touch automation. Its modular design integrates with other servers and a four source/six zone audio preamplifier and home theater automation system.

The server uses advanced RJ-45 connections for its keypad and 3.5 millimeter jacks for its infrared flashers for quick and reliable installations. A system designer only has to program the unit once with programming options that include on-board hardware for configuring "on-the-fly" or an easy-to-use windows based software. The master keypads control field operations, and thus, each location requires one of the two master keypads.

A first master keypad can be programmed to provide the end user with sophisticated control for up to four sources or "favorites." The second master keypad can be designed for advanced control and automation for up to eight sources or "favorites." The central server's modular architecture allows a system designer to "fine tune" the desired level of control for each location by adding accessory keypads or control modules. The keypads and controls are fully compatible for installers and designers and can mix and match to create virtually any combination.

The master keypads also provide an end user with valuable information such as whether the system is off, on, and/or muted. It also allows a determination of which source is currently selected within the zone. The master keypads can be custom labeled to match the end user's system on "favorites" for good level of intuitive operation.

The system architecture allows a system designer to change the "identity" of accessory keypads each time a new source is selected, providing specific control over each component. This silencer volume control mutes rooms not in use and provides independent local volume control. The keypads and controls can integrate quickly and easily via RJ-45 connections.

A four source, six zone, audio preamplifier commands distributed audio systems as a command center. Four sources can be sought simultaneously in up to six different zones. The volume level can be independently adjusted in each of the six zones.

A central server is built in and a telephone system interface would allow paging throughout all zones and two programming options: on-board hardware for configuring on the fly and an easy-to-use windows based software. This preamplifier controller blends seamlessly with the system's integration amplifier and allows control voltages and line level audio signals to be transferred on a single cable without the need for RCA interconnects for simple, fast and error-free installation. It is possible to use ceiling mount speakers with the system and audio/video distribution amplifiers.

Having described the invention in detail, those skilled in the art will appreciate that modifications may be made of the invention without departing from its spirit. Therefore, it is not intended that the scope of the invention be limited to the specific embodiment illustrated and described. Rather it is intended that the scope of the invention be determined by the appended claims and their equivalents.

What is claimed is:

1. An audio amplifier power and temperature controller comprising:
    power receiving means for receiving power from a power source to an audio amplifier;
    power condition switching control means responsive to said power receiving means for switching components of an audio amplifier during a plurality of power conditions, said power condition switching control means including thermal status monitoring and controlling means for monitoring thermal status of operating values of audio amplifier components and responsively decreasing power to the audio amplifier components to protect the audio amplifier components against damage caused by excess heat and for responsively increasing power when the audio amplifier components return to normal thermal operating conditions; and
    network condition monitoring means for monitoring network conditions of the audio amplifier to protect and enhance performance an audio amplifier within a network.

2. The audio amplifier power and temperature controller of claim 1 wherein said power receiving means includes a power receiving circuit with a plurality of conductors positioned to receive power from a power source.

3. The audio amplifier power and temperature controller of claim 2 wherein said power source is a source of alternating current.

4. The audio amplifier power and temperature controller of claim 2 wherein said power source is a direct current power supply.

5. The audio amplifier power and temperature controller of claim 2 wherein said power source is a power transformer.

6. The audio amplifier power and temperature controller of claim 2 wherein said power receiving means further includes power sensing circuitry and switch circuitry.

7. The audio amplifier power and temperature controller of claim 1 wherein said power condition switching control means includes a power condition switching control circuit which switchingly controls power from the power receiving circuit to other components of the audio amplifier.

8. The audio amplifier power and temperature controller of claim 7 wherein said power condition switching control circuit is responsive to power supplied during start up and during continuous operation of the amplifier.

9. The audio amplifier power and temperature controller of claim 7 wherein said power condition switching control circuit includes soft starting means.

10. The audio amplifier power and temperature controller of claim 9 wherein said soft starting means is a soft start circuit responsive to said power receiving circuit for limiting inrush current from said power receiving circuit and for slowly ramping up to an audio amplifier on-state.

11. The audio amplifier power and temperature controller of claim 10 wherein said soft starting circuit includes a voltage regulating circuit connected to a voltage supply which regulates input voltage to said soft start circuit.

12. The audio amplifier power and temperature controller of claim 1 wherein said thermal status monitor and controlling means includes a thermal status monitoring and controlling circuit.

13. The audio amplifier power and temperature controller of claim 1 wherein said thermal status monitor and controlling means include a micro-controller and software programs embedded within said micro-controller.

14. The audio amplifier power and temperature controller of claim 7 wherein said power condition switching control circuit includes output monitoring means to protect said amplifier during a high current condition.

15. The audio amplifier power and temperature controller of claim 1 further comprising visual feedback means responsive to said power condition switching control means for providing visual operating and error status conditions.

16. The audio amplifier power and temperature controller of claim 15 wherein said visual feedback means include indicating means for indicating at least one predetermined visual signal and a plurality of light sources responsive to said indicating means to visually display light representing the at least one predetermined visual signal.

17. An audio amplifier power and temperature controller comprising:
    power receiving means for receiving power from a power source to an audio amplifier, said power receiving means including a power receiving circuit with a plurality of conductors positioned to receive power from a power source, power sensing circuitry and switch circuitry, a plurality of fuses connected to said conductors; a damping capacitor connected to said conductors; and a main power transformer connected to one of said fuses and one of said conductors;
    power condition switching control means responsive to said power receiving means for switching components of an audio amplifier during a plurality of power conditions, said power condition switching control means including thermal status monitoring and controlling means for monitoring thermal status of operating values of audio amplifier components and responsively decreasing power to the audio amplifier components to protect the audio amplifier components against damage caused by excess heat and for responsively increasing power when the audio amplifier components return to normal thermal operating conditions, output monitoring means to protect said amplifier during a high current condition, input power discriminating means responsive to said power receiving means for discriminating between incoming audio component signals to switch said audio amplifier to the on-state, and brown-out protecting means for preventing said audio amplifier from going into and remaining in a circuit protection or sleep mode by continuously monitoring said audio amplifier for normal current conditions and responsively resuming normal current amplifier operations when normal current conditions occur;

soft starting means within said power condition switching control means responsive to said power receiving means for limiting inrush current from said power receiving means and for slowly ramping up to an audio amplifier on-state, said soft start means including a power level detection circuit to detect voltage changes by sensing frequency changes and voltage null points, a micro-controller responsive to said power level detection circuit to monitor low power conditions and high power conditions, and a voltage regulating circuit connected to a voltage supply which regulates input voltage to said soft start circuit;

wave analyzing embedded software within said micro-controller for analyzing the sinusoidal waves detected by said power level detection circuit to determine a voltage null so as to allow said audio amplifier to turn on just prior to a voltage null and to gradually ramp up to a fully on-start or high power condition;

visual feedback means responsive to said power condition switching control means for providing visual operating and error status conditions, said visual feedback means including indicating means for indicating at least one predetermined visual signal and a plurality of light sources responsive to said indicating means to visually display light representing the at least one predetermined visual signal; and network condition monitoring means for monitoring network conditions of the audio amplifier to protect and enhance performance an audio amplifier within a network.

18. A method of controlling power to an audio amplifier comprising the steps of:

receiving power from a power source;

switching components in said audio amplifier by limiting inrush current from said power source, slowly ramping up said power to an audio amplifier on-state, monitoring the thermal status of the operating values of said audio amplifier components, responsively decreasing power to said audio amplifier components to protect said audio amplifier components against damage caused by excess heat, and responsively increasing power when said audio amplifier components return to normal thermal operating conditions;

further switching components in said audio amplifier by monitoring current output circuits of said audio amplifier to protect said audio amplifier during a high current condition by disconnecting a load to the current output circuits and reconnecting the load to the current output circuits when normal operating current conditions resume, discriminating between incoming audio component signals to switch the audio amplifier to the on-state and transient line voltage to momentarily sense the signal but not activating the audio amplifier to the on-state, and protectively preventing the audio amplifier from going into and remaining in a circuit protection made by continuously monitoring the audio amplifier for normal current conditions and responsively resuming normal amplifier operations when normal current conditions occur;

further limiting said inrush current by sensing frequency changes and voltage null points and monitoring low power conditions and high power conditions;

monitoring the output current circuits to determine if a full shut down of said audio amplifier is desirable to protect the audio amplifier and other system components when connected thereto; and providing visual operating and error status feedback for enhancing diagnosis of operating and error status conditions.

19. An audio amplifier power and temperature controller comprising:

power receiving means for receiving power from a power source to an audio amplifier, said power receiving means including, a power receiving circuit with a plurality of conductors positioned to receive power from a power source, power sensing circuitry and switch circuitry;

power condition switching control means responsive to said power receiving means for switching components of an audio amplifier during a plurality of power conditions, said power condition switching control means including thermal status monitoring and controlling means for monitoring thermal status of operating values of audio amplifier components and responsively decreasing power to the audio amplifier components to protect the audio amplifier components against damage caused by excess heat and for responsively increasing power when the audio amplifier components return to normal thermal operating conditions;

network condition monitoring means for monitoring network conditions of the audio amplifier to protect and enhance performance an audio amplifier within a network; and wherein said switch circuitry consists of resistors and diodes in a resistor-diode network.

20. An audio amplifier power and temperature controller comprising:

power receiving means for receiving power from a power source to an audio amplifier;

power condition switching control means responsive to said power receiving means for switching components of an audio amplifier during a plurality of power conditions, said power condition switching control means including thermal status monitoring and controlling means for monitoring thermal status of operating values of audio amplifier components and responsively decreasing power to the audio amplifier components to protect the audio amplifier components against damage caused by excess heat and for responsively increasing power when the audio amplifier components return to normal thermal operating conditions;

network condition monitoring means for monitoring network conditions of the audio amplifier to protect and enhance performance an audio amplifier within a network; and wherein said power receiving means includes a power receiving circuit with a plurality of conductors positioned to receive power from a power source, a plurality of fuses connected to said conductors, a damping capacitor connected to said conductors, and a main power transformer connected to one of said fuses and one of said conductors for supplying power to said power condition switching control means.

21. An audio amplifier power and temperature controller comprising:

power receiving means for receiving power from a power source to an audio amplifier;

power condition switching control means responsive to said power receiving means for switching components of an audio amplifier during a plurality of power conditions, said power condition switching control means including thermal status monitoring and controlling means for monitoring thermal status of operating values of audio amplifier components and responsively decreasing power to the audio amplifier components to protect the audio amplifier components against damage caused by excess heat and for responsively increasing power when the audio amplifier components return to normal thermal operating conditions;

network condition monitoring means for monitoring network conditions of the audio amplifier to protect and enhance performance an audio amplifier within a network;

wherein said power condition switching control means includes a power condition switching control circuit which switchingly controls power from said power receiving means to other components of the audio amplifier;

wherein said power condition switching control circuit includes soft starting means consisting of a soft start circuit responsive to said power receiving circuit for limiting inrush current from said power receiving circuit and for slowly ramping up to an audio amplifier on-state; and wherein said soft starting circuit includes a power level detection circuit to detect voltage changes by sensing frequency changes and voltage null points, and a micro-controller responsive to said power level detection circuit to monitor low power conditions and high power conditions.

22. The audio amplifier power and temperature controller of claim 21 wherein said micro-controller includes wave analyzing means for analyzing the sinusoidal waves detected by said power level detection circuit to determine a voltage null so as to allow said audio amplifier to turn on just prior to a voltage null and to gradually ramp up to a fully on-start or high power condition.

23. The audio amplifier power and temperature controller of claim 22 wherein said wave analyzing means consists of software programs embedded or stored within said micro-controller, said software programs being independent of micro-controller device technology.

24. The audio amplifier power and temperature controller of claim 21 wherein said power level detection circuit consists of a power triac.

25. An audio amplifier power and temperature controller comprising:

power receiving means for receiving power from a power source to an audio amplifier;

power condition switching control means responsive to said power receiving means for switching components of an audio amplifier during a plurality of power conditions, said power condition switching control means including thermal status monitoring and controlling means for monitoring thermal status of operating values of audio amplifier components and responsively decreasing power to the audio amplifier components to protect the audio amplifier components against damage caused by excess heat and for responsively increasing power when the audio amplifier components return to normal thermal operating conditions;

network condition monitoring means for monitoring network conditions of the audio amplifier to protect and enhance performance an audio amplifier within a network;

wherein said power condition switching control means includes a power condition switching control circuit which switchingly controls power from said power receiving means to other components of the audio amplifier;

wherein said power condition switching control circuit includes soft starting means consisting of a soft start circuit responsive to said power receiving circuit for limiting inrush current from said power receiving circuit and for slowly ramping up to an audio amplifier on-state;

wherein said soft starting circuit includes a voltage regulating circuit connected to a voltage supply which regulates input voltage to said soft start circuit; and wherein said voltage regulating circuit is comprised of a voltage regulator, one or more Zener or other diodes and capacitors connected to power and ground, a power transformer, a bridge rectifier connected to said power transformer, a capacitor connected to ground, and a capacitor positioned to rectify the voltage from the power transformer.

26. An audio amplifier power and temperature controller comprising:

power receiving means for receiving power from a power source to an audio amplifier;

power condition switching control means responsive to said power receiving means for switching components of an audio amplifier during a plurality of power conditions, said power condition switching control means including thermal status monitoring and controlling means for monitoring thermal status of operating values of audio amplifier components and responsively decreasing power to the audio amplifier components to protect the audio amplifier components against damage caused by excess heat and for responsively increasing power when the audio amplifier components return to normal thermal operating conditions;

network condition monitoring means for monitoring network conditions of the audio amplifier to protect and enhance performance an audio amplifier within a network;

wherein said power condition switching control means includes a power condition switching control circuit which switchingly controls power from said power receiving means to other components of the audio amplifier; and wherein said power condition switching control circuit includes input power discriminating means responsive to said power receiving means for discriminating between incoming audio component signals to switch said audio amplifier to the on-state.

27. An audio amplifier power and temperature controller comprising:

power receiving means for receiving power from a power source to an audio amplifier;

power condition switching control means responsive to said power receiving means for switching components of an audio amplifier during a plurality of power conditions, said power condition switching control means including thermal status monitoring and controlling means for monitoring thermal status of operating values of audio amplifier components and responsively decreasing power to the audio amplifier components to protect the audio amplifier components against damage caused by excess heat and for responsively increasing power when the audio amplifier components return to normal thermal operating conditions;

network condition monitoring means for monitoring network conditions of the audio amplifier to protect and enhance performance an audio amplifier within a network;

wherein said power condition switching control means includes a power condition switching control circuit which switchingly controls power from said power receiving means to other components of the audio amplifier; and wherein said power condition switching control circuit includes brown-out protecting means for preventing said audio amplifier from going into and remaining in a circuit protection or sleep mode by continuously monitoring said audio amplifier for normal current conditions and responsively resuming normal current amplifier operations normal current conditions occur.

28. A method of controlling power to an audio amplifier comprising the steps of:

receiving power from a power source;

switching components in said audio amplifier by limiting inrush current from said power source, slowly ramping up said power to an audio amplifier on-state, monitoring the thermal status of the operating values of said audio amplifier components, responsively decreasing power to said audio amplifier components to protect said audio amplifier components against damage caused by excess heat, and responsively increasing power when said audio amplifier components return to normal thermal operating conditions; and within said switching step, the further step of monitoring of current output circuits of said audio amplifier to protect said audio amplifier during a high current condition by disconnecting a load to the current output circuits and reconnecting the load to the current output circuits when normal operating current conditions resume, discriminating between incoming audio component signals to switch the audio amplifier to the on-state and transient line voltage to momentarily sense the signal but not activating the audio amplifier to the on-state, and protectively preventing the audio amplifier from going into and remaining in a circuit protection mode by continuously monitoring the audio amplifier for normal current conditions and responsively resuming normal amplifier operations when normal current conditions occur.

29. A method of controlling power to an audio amplifier comprising the steps of:

receiving power from a power source;

switching components in said audio amplifier by limiting inrush current from said power source, slowly ramping up said power to an audio amplifier on-state, monitoring the thermal status of the operating values of said audio amplifier components, responsively decreasing power to said audio amplifier components to protect said audio amplifier components against damage caused by excess heat, and responsively increasing power when said audio amplifier components return to normal thermal operating conditions;

limiting said inrush current sensing frequency changes and voltage null points and monitoring low power conditions and high power conditions; and monitoring output current circuits of said audio amplifier to determine if a full shut down of said audio amplifier is desirable to protect said audio amplifier and other system components when connected thereto.

* * * * *